United States Patent
Miyashita et al.

[11] Patent Number: 5,835,516
[45] Date of Patent: Nov. 10, 1998

[54] SEMICONDUCTOR LASER DEVICE AND METHOD OF FABRICATING SEMICONDUCTOR LASER DEVICE

[75] Inventors: Motoharu Miyashita; Hirotaka Kizuki; Yasuaki Yoshida; Yutaka Mihashi; Yasutomo Kajikawa; Shoichi Karakida; Yuji Ohkura, all of Tokyo, Japan

[73] Assignee: Mitsubishi Denki Kabushiki Kaisha, Tokyo, Japan

[21] Appl. No.: 569,881

[22] Filed: Dec. 8, 1995

[30] Foreign Application Priority Data

Dec. 13, 1994 [JP] Japan ............................ 6-309021
Sep. 26, 1995 [JP] Japan ............................ 7-247978

[51] Int. Cl.$^6$ ............................ H01S 3/19; H01L 21/20
[52] U.S. Cl. ............................ 372/46; 438/41; 438/44
[58] Field of Search ............................ 372/45, 46, 48; 438/39, 40, 41, 42, 43, 44

[56] References Cited

U.S. PATENT DOCUMENTS

| | | | |
|---|---|---|---|
| 4,567,060 | 1/1986 | Hayakawa et al. | 427/87 |
| 4,800,565 | 1/1989 | Yoshizawa et al. | 372/45 |
| 4,899,349 | 2/1990 | Hayakawa et al. | 372/44 |
| 5,042,045 | 8/1991 | Sato | 372/46 |
| 5,111,470 | 5/1992 | Hosoba et al. | 372/46 |
| 5,185,755 | 2/1993 | Mori et al. | 372/46 |
| 5,210,767 | 5/1993 | Asimoto et al. | 372/46 |
| 5,212,704 | 5/1993 | Chen et al. | 372/45 |
| 5,272,109 | 12/1993 | Motoda | 372/45 |
| 5,395,792 | 3/1995 | Ikawa et al. | 437/129 |
| 5,426,658 | 6/1995 | Kaneno et al. | 372/46 |

FOREIGN PATENT DOCUMENTS

| | | |
|---|---|---|
| 0292276 | 11/1988 | European Pat. Off. . |
| 0579244 | 1/1994 | European Pat. Off. . |
| 2263708 | 8/1993 | Germany . |
| 4330987 | 3/1994 | Germany . |
| 63-269593 | 11/1988 | Japan . |
| 1-217990 | 8/1989 | Japan . |
| 5-30436 | 11/1993 | Japan . |
| 6-314850 | 11/1994 | Japan . |
| 7-50445 | 2/1995 | Japan . |
| 7-40618 | 5/1995 | Japan . |

OTHER PUBLICATIONS

M. J. Adams, "Heterostructure Injection Lasers", Optics and Laser Technology, Dec. 1972, pp. 273–280.

Kish et al., "Planar native–oxide buried–mesa $Al_xGA_{1-x}AS$–$In_{0.5}$ $(Al_yGa_{1-y})_{0.5}P$–$In_{0.5}(Al_zGa_{1-z})_{0.5}P$ visible–spectrum laser diodes", J. Appl. phys., vol. 71, No. 6, Mar. 15, 1992, pp. 2521–2525.

Takayama et al, "Low Operating Current Self–Sustained Pulsation GaAlAs Laser Diodes With A Real Refractive Index Guided Structure", Applied Physics Letters, Vol. 65, No. 10, Sep. 1994, pp. 1211–1212.

*Primary Examiner*—James W. Davie
*Attorney, Agent, or Firm*—Leydig, Voit & Mayer, Ltd.

[57] ABSTRACT

A method of fabricating a semiconductor laser device includes successively forming an active layer and upper cladding layers on a lower cladding layer, etching and removing portions except regions of the upper cladding layers where a current is to flow to form a stripe-shaped ridge structure, and forming a buffer layer comprising $Al_xGa_{1-x}As$ having an Al composition ratio x of 0 to 0.3 on a surface of the upper cladding layers exposed by the etching and forming a current blocking layer of first conductivity type $Al_yGa_{1-y}As$ having an Al composition ratio y of at least 0.5 on the buffer layer to bury portions of the upper cladding layers which are not removed by the etching process. Therefore, since the layer grown on the upper cladding layer exposed by etching of AlGaAs or GaAs having a low Al composition ratio (0–0.3), three-dimensional growth of and crystalline defects in the buffer layer are suppressed. Current leakage is suppressed, so that a semiconductor laser device having a low threshold current and a high efficiency is fabricated with a stable yield.

28 Claims, 18 Drawing Sheets

Fig.4 (a1)
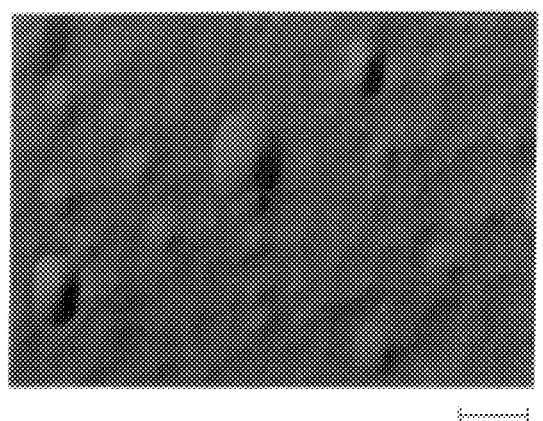
surface morphology  20 μm
Fig.4 (a2)
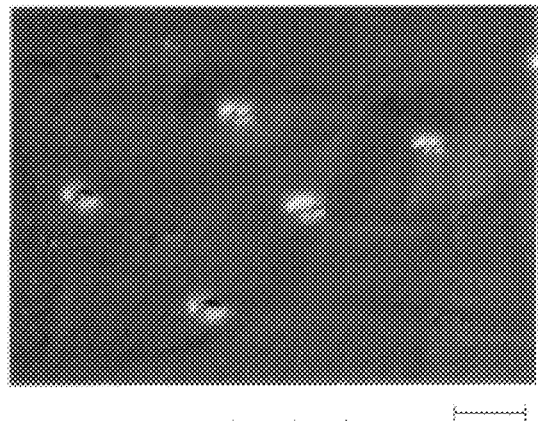
image of etch-pits  10 μm
Fig.4 (b1)
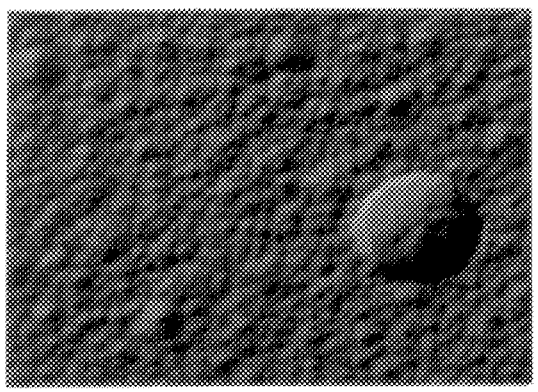
surface morphology  20 μm
Fig.4 (b2)
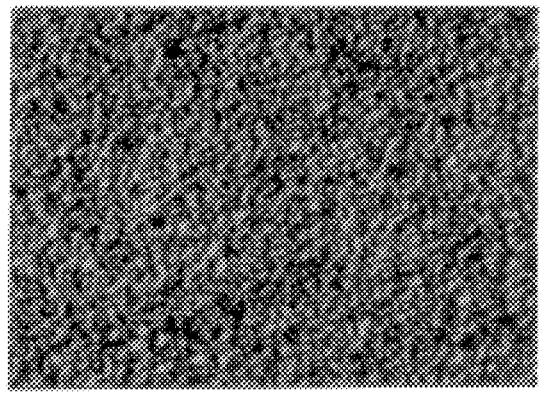
image of etch-pits  10 μm

SEMICONDUCTOR LASER DEVICE AND METHOD OF FABRICATING SEMICONDUCTOR LASER DEVICE

FIELD OF THE INVENTION

This invention relates to a semiconductor laser device and a method of fabricating the laser and, more particularly, to buried ridge SAS (Self-Aligned Structure) semiconductor laser devices and method of fabricating those lasers.

BACKGROUND OF THE INVENTION

FIGS. 18(a)–18(e) are sectional views illustrating process steps in a prior art method of fabricating a buried ridge semiconductor laser device having an AlGaAs current blocking layer. Initially, as shown in FIG. 18(a), an n type $Al_{0.5}Ga_{0.5}As$ lower cladding layer 2, an $Al_{0.1}Ga_{0.9}As$ active layer 3, a p type $Al_{0.5}Ga_{0.5}As$ first upper cladding layer 4, a p type $Al_{0.7}Ga_{0.3}As$ etching stop layer 5, a p type $Al_{0.5}Ga_{0.5}As$ second upper cladding layer 6, and a p type GaAs cap layer 7 are successively epitaxially grown on an n type GaAs substrate 1. Next, as shown in FIG. 18(b), an SiON film 13 is formed on a stripe-shaped region of the p type GaAs cap layer 7 and, using the SiON film 13 as a mask, the p type GaAs cap layer 7 and the p type $Al_{0.5}Ga_{0.5}As$ second upper cladding layer 6 are selectively etched. This etching is stopped automatically when a surface of the p type $Al_{0.7}Ga_{0.3}As$ etching stop layer 5 is exposed. In this way, a ridge structure comprising the second upper cladding layer 6 and the cap layer 7 is formed. In the step of FIG. 18(c), an n type $Al_{0.7}Ga_{0.3}As$ current blocking layer 9 is epitaxially grown on the exposed surface of the etching stop layer 5 and at side surfaces of the ridge structure to bury the ridge where portions of the cap layer 7 and the second upper cladding layer 6 were removed by etching. Then, as shown in FIG. 18(d), after removing the SiON film 13, a p type GaAs contact layer 10 is epitaxially grown over the entire surface. Finally, after the n type GaAs substrate 1 is ground to a thickness of about 100 μm, a front surface electrode 11 is formed on a surface of the contact layer 10 and a rear surface electrode 12 is formed at the rear surface of the GaAs substrate 1, resulting in a semiconductor laser device as shown in FIG. 18(e).

In this buried ridge semiconductor laser device, a forward bias voltage is applied between the front surface electrode 11 and the rear surface electrode 12, whereby electrons and holes are injected into the active layer, emitting laser light from the active layer. In this emission, however, since a current flows mainly through the ridge structure due to the current blocking layer, and the refractive index of the ridge structure region is larger than that of the current blocking layer region, the light emitted from the active layer is confined in the ridge structure region.

Generally, when AlGaAs having a large Al composition ratio is epitaxially grown, it is probable that three-dimensional growth will occur at the growth surface because the migration length of Al is short. If three-dimensional growth occurs at the growth surface, layer growth becomes difficult, whereby crystalline defects, such as dislocations, which are caused by the three-dimensional growth, are produced in the grown layers. Also, when another epitaxial layer is regrown on a surface of the AlGaAs layer having a large Al composition ratio after exposure of the surface to air, the regrown layer includes many crystalline defects.

In the method of fabricating the buried ridge semiconductor laser device, the n type $Al_{0.7}Ga_{0.3}As$ is regrown on the surface of the p type $Al_{0.7}Ga_{0.3}As$ etching stop layer 5, which is exposed by the etching for forming the ridge structure, thereby forming the current blocking layer 9. More specifically, on the surface of the $Al_{0.7}Ga_{0.3}As$ etching stop layer 5 having a large Al composition ratio, after the etching process in air for forming the ridge structure, the $Al_{0.7}Ga_{0.3}As$ current blocking layer 9 having a large Al composition ratio is regrown. Therefore, many crystalline defects, such as dislocations, are produced in the current blocking layer 9, causing current leakage. Consequently, the current that flows through the ridge structure is decreased and the threshold current for laser oscillation is increased, resulting in a reduction in light emission efficiency.

In order to improve the crystalline quality of the current blocking layer, a method of fabricating a semiconductor laser device, in which the layer on the substrate side for growing the current blocking layer is not an AlGaAs layer having a large Al composition ratio, but a GaAs layer, is used. FIGS. 19(a)–19(e) are sectional views illustrating process steps in this fabricating method. Initially, as shown in FIG. 19(a), an n type $Al_{0.5}Ga_{0.5}As$ lower cladding layer 2, an $Al_{0.1}Ga_{0.9}As$ active layer 3, a p type $Al_{0.5}Ga_{0.5}As$ first upper cladding layer 4, a p type GaAs first etching stop layer 114, a p type $Al_{0.7}Ga_{0.3}As$ second etching stop layer 15, a p type $Al_{0.5}Ga_{0.5}As$ second upper cladding layer 6, and a p type GaAs cap layer 7 are successively epitaxially grown on an n type GaAs substrate 1. Next, as shown in FIG. 19(b), an SiON film 13 is deposited on a stripe-shaped region of the p type GaAs cap layer 7 and, using the SiON film 13 as a mask, the p type GaAs cap layer 7 and the p type $Al_{0.5}Ga_{0.5}As$ second upper cladding layer 6 are selectively etched. This etching is stopped automatically when a surface of the p type $Al_{0.7}Ga_{0.3}As$ second etching stop layer 15 is exposed. Further, a region of the exposed surface of the second etching stop layer 15 is etched. This etching is stopped automatically when a surface of the p type GaAs first etching stop layer 114 is exposed. In this way, a ridge structure comprising the second etching stop layer 15, the second upper cladding layer 6, and the cap layer 7 is formed. In the step of FIG. 19(c), an n type $Al_{0.7}Ga_{0.3}As$ current blocking layer 9 is epitaxially grown on the exposed surface of the p type GaAs first etching stop layer 114 and at side surfaces of the ridge structure to bury the ridge where portions of the cap layer 7, the second upper cladding layer 6, and the second etching stop layer 15 have been removed by etching. Then, as shown in FIG. 19(d), after removing the SiON film 13, a p type GaAs contact layer 10 is epitaxially grown over the entire surface. Finally, after the n type GaAs substrate 1 is ground to a thickness of about 100 μm, a front surface electrode 11 is formed on a surface of the contact layer 10 and a rear surface electrode 12 is formed at the rear surface of the GaAs substrate 1, resulting in a semiconductor laser device as shown in FIG. 19(e).

In this method of fabricating the buried ridge semiconductor laser device, the n type $Al_{0.7}Ga_{0.3}As$ current blocking layer 9 is epitaxially grown not on the surface of an AlGaAs layer having a large Al composition ratio, but on the surface of the p type GaAs first etching stop layer 114. Therefore, an $Al_{0.7}Ga_{0.3}As$ current blocking layer having reduced crystalline defects can be obtained, as compared with the current blocking layer in the fabricating method shown in FIGS. 18(a)–18(e).

FIGS. 20(a)–20(e) are sectional views illustrating process steps in a prior art method of fabricating an SAS semiconductor laser device described in Japanese Patent Publication (examined patent application) Hei 7-40618. These figures are sectional views perpendicular to an optical waveguide direction of the laser. In FIGS. 20(a)–20(e), reference numeral 1 designates an n type GaAs substrate. Reference numeral 22 designates an n type $Al_{0.55}Ga0.45$ lower cladding layer. Reference numeral 23 designates an $Al_{0.12}Ga_{0.88}As$ active layer. Reference numeral 24 designates a p type $Al_{0.55}Ga_{0.45}As$ first upper cladding layer. Reference numeral 35 designates a p type GaAs protecting layer. Reference numeral 26 designates an n type $Al_{0.75}Ga_{0.25}As$ current blocking layer. Reference numeral 27 designates a p type GaAs cap layer. Reference numeral 28 designates a p type $Al_{0.55}Ga_{0.45}As$ second upper cladding layer. Reference numeral 29 designates a p type GaAs contact layer. Reference numeral 30 designates a resist film.

A description is given of the fabricating method. Initially, as shown in FIG. 20(a), an n type $Al_{0.55}Ga_{0.45}As$ lower cladding layer 22, an $Al_{0.12}Ga_{0.88}As$ active layer 23, a p type $Al_{0.55}Ga_{0.45}As$ first upper cladding layer 24, a p type GaAs protecting layer 35, an n type $Al_{0.75}Ga_{0.25}As$ current blocking layer 26, and a p type GaAs cap layer 27 are successively grown on an n type GaAs substrate 1. Next, as shown in FIG. 20(b), a resist film 30 having a stripe-shaped opening portion is deposited on the p type GaAs cap layer 27 using a photolithographic technique. In the step of FIG. 20(c), using the resist film 30 as a mask, the p type GaAs cap layer 27 and the n type $Al_{0.75}Ga_{0.25}As$ current blocking layer 26 are selectively etched, thereby forming a stripe-shaped groove 40. Further, as shown in FIG. 20(d), after removing the resist film 30, a p type $Al_{0.55}Ga_{0.45}As$ second upper cladding layer 28 and a p type GaAs contact layer 29 are successively formed over the entire surface.

The p type GaAs protecting layer 35 in the stripe-shaped groove region is between the p type $Al_{0.55}Ga_{0.45}As$ first upper cladding layer 24 and the p type $Al_{0.55}Ga_{0.45}As$ second upper cladding layer 28, except in the stripe-shaped groove region, where it is between the first upper cladding layer 24 and the n type $Al_{0.75}Ga_{0.25}As$ current blocking layer 26. More specifically, the protecting layer 35 in both regions is sandwiched between semiconductor layers, each having a band gap energy larger than that of GaAs. Therefore, a quantum well is formed in the GaAs protecting layer 35 and discrete energy levels are produced at a conduction band and a valence band in the quantum well. Accordingly, the band gap energy of the p type GaAs protecting layer 35 has a difference in energy between respective lowest levels of the conduction band and the valence band, and it is larger than that of bulk GaAs. In addition, the thinner the protecting layer 35 is, the larger the band gap energy of the GaAs protecting layer 35 is. The p type GaAs protecting layer 35 has a thickness at which the band gap energy is equal to or larger than that of the $Al_{0.12}Ga_{0.88}As$ active layer 23 due to this quantum effect.

In the prior art method of fabricating the buried ridge semiconductor laser device shown in FIGS. 18(a)–18(e), the $Al_{0.7}Ga_{0.3}As$ current blocking layer 9 having a large Al composition ratio is regrown on the surface of the $Al_{0.7}Ga_{0.3}As$ etching stop layer 5 having a large Al composition ratio and which is exposed to air during the process for forming the ridge structure. Therefore, three-dimensional growth occurs at the growth interface, whereby many crystalline defects, such as dislocations, which are caused by the three-dimensional growth, are produced in the current blocking layer, which causes current leakage. Consequently, the current which flows through the ridge structure is decreased and the threshold current of laser oscillation is increased, resulting in a reduction in light emission efficiency.

In the prior art method of fabricating the buried ridge semiconductor laser device shown in FIGS. 19(a)–19(e), the current blocking layer 9 is grown on the GaAs first etching stop layer 114. Therefore, a current blocking layer having better crystalline quality than that in the fabricating method in which the current blocking layer is grown on the $Al_{0.7}Ga_{0.3}As$ etching stop layer 5, as shown in FIGS. 18(a)–18(e), is obtained. In this method, for a semiconductor laser device having an oscillation wavelength of 0.78–0.81 $\mu$m, the p type GaAs first etching stop layer 114 is required to have a thickness below about 3 nm in order not to absorb the light emitted from the active layer 3. However, in the growth of the thin GaAs layer having a thickness below 3 nm, control of film thickness is difficult. Also, in etching the p type $Al_{0.7}Ga_{0.3}As$ second etching stop layer 15, it is difficult to stop the etching perfectly at the surface of the p type GaAs first etching stop layer 114, even using a selective etching technique and, unavoidably, the surface portion of the GaAs layer is etched to some degree. Therefore, it is probable that the whole of the GaAs layer is etched because the GaAs layer is extremely thin, below 3 nm.

The prior art SAS semiconductor laser device shown in FIGS. 20(a)–20(e) has a p type GaAs protecting layer 35. The layer 35 is required to have a thickness at which the band gap energy is equal to or larger than that of the active layer 23 due to a quantum effect to produce a semiconductor laser device having an oscillation wavelength of 0.78–0.81 $\mu$m. The protecting layer 35 must be extremely thin, i.e., have a thickness below about 3 nm. However, when the p type GaAs protecting layer 35 is thin, it is probable that the protecting layer 35 may be etched and removed simultaneously with the etching of the n type $Al_{0.75}Ga_{0.25}As$ current blocking layer 26 so that a surface of the p type $Al_{0.55}Ga_{0.45}As$ first upper cladding layer 24 is exposed. In this case, as described above, it is difficult to grow a p type $Al_{0.55}Ga_{0.45}As$ second upper cladding layer 28 having good crystalline quality, with good reproducibility, on the surface of $Al_{0.55}Ga_{0.45}As$ first upper cladding layer 24 having a large Al composition ratio that is exposed to air during the etching, resulting in deterioration of laser characteristics.

In addition, as described above, it is probable that an AlGaAs layer having a large Al composition ratio causes three-dimensional growth because the migration length of Al is short. Therefore, especially when AlGaAs is regrown on the substrate after the process for forming the stripe-shaped groove 40, it is probable that three-dimensional growth will occur at the regrowth interface, whereby many defects, such as dislocations, are produced in the grown layers. In the method of fabricating the SAS semiconductor laser device, since the p type $Al_{0.55}Ga_{0.45}As$ second upper cladding layer 28 having a large Al composition ratio is regrown directly on the p type GaAs protecting layer 35, defects, such as dislocations, are produced in the p type $Al_{0.55}Ga_{0.45}As$ second upper cladding layer 28 and deterioration of laser characteristics is caused by the defects.

SUMMARY OF THE INVENTION

It is an object of the present invention to provide a buried ridge semiconductor laser device having reduced current leakage and including a current blocking layer having good crystalline quality, and a method of fabricating the semiconductor laser device with good stability and reproducibility.

It is another object of the present invention to provide an SAS semiconductor laser device including a second upper cladding layer having good crystalline quality, and a method of fabricating the SAS semiconductor laser device in which good laser characteristics can be obtained by forming the second upper cladding layer with good stability and reproducibility.

Other objects and advantages of the present invention will become apparent from the detailed description given hereinafter; it should be understood, however, that the detailed description and specific embodiment are given by way of illustration only, since various changes and modifications within the scope of the invention will become apparent to those skilled in the art from this detailed description.

According to a first aspect of the present invention, a method of fabricating a semiconductor laser device includes successively forming, on a lower cladding layer comprising a first conductivity type semiconductor, an active layer, and upper cladding layers comprising a second conductivity type semiconductor etching and removing portions except regions of the upper cladding layers where a current flows in a prescribed depth to form a stripe-shaped ridge structure comprising the remaining regions of the upper cladding layers. A buffer layer comprising $Al_xGa_{1-x}As$ is formed having an Al composition ratio x of 0 to 0.3, which is grown on a surface of the upper cladding layers exposed by the etching, and forming a current blocking layer comprising first conductivity type $Al_yGa_{1-y}As$ having an Al composition ratio y of 0.5 or more, which is grown on the buffer layer to bury portions of the upper cladding layers which are exposed by the etching. Therefore, since the layer grown first on the surface of the upper cladding layers which is exposed by etching is selected from AlGaAs and GaAs having a low Al composition ratio (0–0.3), three-dimensional growth on the buffer layer is suppressed, whereby a buffer layer having reduced crystalline defects is formed. Accordingly, the AlGaAs current blocking layer subsequently grown also has reduced crystalline defects and good crystalline quality. Consequently, current leakage is suppressed, whereby a semiconductor laser device having a low threshold current and a high efficiency can be fabricated with a stable yield.

According to a second aspect of the present invention, in fabricating a semiconductor laser device, the upper cladding layers comprise a first upper cladding layer, an etching stop layer comprising $Al_zGa_{1-z}As$ having an Al composition ratio z of 0.6 or more, and a second upper cladding layer comprising $Al_wGa_{1-w}As$ having an Al composition ratio w not exceeding 0.6, successively laminated on the active layer. The stripe-shaped ridge structure is formed by removing a portion, except a region of the second upper cladding layer where a current flows, by etching which is stopped when a surface of the etching stop layer is exposed, to form a stripe-shaped ridge structure comprising the remaining region of the second upper cladding layer. Therefore, stability and reproducibility in the etching for forming the ridge structure are improved. In addition, since the layer grown first on the exposed surface of the etching stop layer and at a side surface of the ridge structure comprises one of AlGaAs and GaAs having a low Al composition ratio (0–0.3), three-dimensional growth at the growth surface of the buffer layer is suppressed, whereby a buffer layer having reduced crystalline defects is formed. Accordingly, the AlGaAs current blocking layer grown subsequently also has reduced crystalline defects and good crystalline quality. Consequently, current leakage is suppressed, whereby a semiconductor laser device having a low threshold current and a high efficiency can be fabricated with a stable yield.

According to a third aspect of the present invention, in fabricating a semiconductor laser device, the buffer layer has a thickness not exceeding the maximum thickness at which a refractive index of a region where light emitted from the active layer is distributed in the ridge structure, and under the ridge structure, in the lower cladding layer, the active layer, the upper cladding layers, and the etching stop layer, is larger by at least 0.007 than those of regions on both sides of the region where the emitted light is distributed in the lower cladding layer, the active layer, the upper cladding layers, the buffer layer, and the current blocking layer. Therefore, the light emitted from the active layer is effectively confined in the ridge structure region, whereby a semiconductor laser device having a stable lateral mode can be fabricated. In addition, since a buffer layer having reduced crystalline defects is obtained as described above, the current blocking layer grown on the buffer layer also has improved crystalline quality. Consequently, current leakage is suppressed, whereby a semiconductor laser device having a low threshold current and a high efficiency can be fabricated with a stable yield.

According to a fourth aspect of the present invention, in fabricating a semiconductor laser device, the buffer layer comprises $Al_xGa_{1-x}As$ having an Al composition ratio x of 0 to 0.3 which is grown at the growth temperature of 300° C. to 500° C. Therefore, in the growth of the buffer layer, three-dimensional growth at the growth surface of the buffer layer is suppressed, whereby a buffer layer having reduced crystalline defects is formed. Accordingly, the AlGaAs current blocking layer grown subsequently also has crystalline defects and good crystalline quality. Consequently, current leakage is suppressed, whereby a semiconductor laser device having a low threshold current and a high efficiency can be fabricated with a stable yield.

According to a fifth aspect of the present invention, a method of fabricating a semiconductor laser device includes successively forming, on a lower cladding layer, comprising a first conductivity type semiconductor, an active layer, a first upper cladding layer comprising second conductivity type AlGaAs, a first etching stop layer comprising second conductivity type $Al_xGa_{1-x}As$ having an Al composition ratio, x, larger than 0 and not exceeding 0.3, a second etching stop layer comprising second conductivity type $Al_yGa_{1-y}As$ having an Al composition ratio y of 0.6 or more, a second upper cladding layer comprising second conductivity type $Al_zGa_{1-z}As$ having an Al composition ratio z not exceeding 0.6, and a cap layer comprising second conductivity type semiconductor, removing a portion, except a region of the second upper cladding layer where a current flows, by etching which is stopped when a surface of the second etching stop layer is exposed, and removing a portion of the second etching stop layer exposed by etching, thereby forming a stripe-shaped ridge structure comprising the remaining regions of the second upper cladding layer and the second etching stop layer. A current blocking layer is formed to bury the portions of the second upper cladding layer and the second etching stop layer which are left after the etching. Therefore, since the current blocking layer is grown on the AlGaAs first etching stop layer having a low Al composition ratio (0 to 0.3), three-dimensional growth at the growth surface is suppressed, whereby the current blocking layer has few crystalline defects and good crystalline quality. Consequently, current leakage is suppressed, whereby a semiconductor laser device having a low threshold current and a high efficiency can be fabricated with a stable yield.

According to a sixth aspect of the present invention, in fabricating a semiconductor laser device, the first etching stop layer has a thickness smaller than the minimum of thicknesses that cause absorption of light emitted from the active layer. Therefore, the current blocking layer has few crystalline defects and good crystalline quality as described above, whereby current leakage is suppressed, a reduction in the laser efficiency and an increase in the threshold current are suppressed. The first etching stop layer is prevented from absorbing the light emitted from the active layer. Consequently, a semiconductor laser device having a low threshold current and a high efficiency can be fabricated with a stable yield.

According to a seventh aspect of the present invention, a semiconductor laser device is fabricated by successively forming, on a lower cladding layer comprising a first conductivity type semiconductor, an active layer, and upper cladding layers comprising a second conductivity type semiconductor, etching and removing portions except regions of the upper cladding layers where a current flows in a prescribed depth to form a stripe-shaped ridge structure comprising the remaining regions of the upper cladding layers. A buffer layer comprising $Al_xGa_{1-x}As$ having an Al composition ratio x of 0 to 0.3 is grown on a surface of the upper cladding layers exposed by etching and a current blocking layer is formed comprising first conductivity type $Al_yGa_{1-y}As$ having an Al composition ratio y of 0.5 or more, grown on the buffer layer to bury portions of the upper cladding layers which are left after the etching. Therefore, since the layer grown first on the surface of the upper cladding layers exposed by etching for forming the ridge structure is selected from AlGaAs and GaAs having a low Al composition ratio (0–0.3), three-dimensional growth at the growth surface of the buffer layer is suppressed, whereby a buffer layer having reduced crystalline defects is formed. Accordingly, the AlGaAs current blocking layer grown subsequently also has reduced crystalline defects and good crystalline quality. Consequently, current leakage is suppressed, whereby a semiconductor laser device having a low threshold current and a high efficiency can be obtained.

According to an eighth aspect of the present invention, in a semiconductor laser device, the upper cladding layers comprise a first upper cladding layer, an etching stop layer comprising $Al_zGa_{1-z}As$ having an Al composition ratio z of 0.6 or more, and a second upper cladding layer comprising $Al_wGa_{1-w}As$ having a composition ratio w not exceeding 0.6, successively laminated on the active layer. The stripe-shaped ridge structure is formed by removing a portion, except a region of the second upper cladding layer where a current flows, by etching which is stopped when a surface of the etching stop layer is exposed, to form the stripe-shaped ridge structure comprising the remaining region of the second upper cladding layer. Therefore, since the layer grown first on the exposed surface of the etching stop layer and at a side surface of the ridge structure comprises AlGaAs or GaAs having a low Al composition ratio (0–0.3), three-dimensional growth at the growth surface of the buffer layer is suppressed, whereby a buffer layer having reduced crystalline defects is formed. Accordingly, the AlGaAs current blocking layer grown subsequently also has reduced crystalline defects and good crystalline quality. Consequently, current leakage is suppressed, whereby a semiconductor laser device having a low threshold current and a high efficiency can be obtained.

According to a ninth aspect of the present invention, in a semiconductor laser device, the buffer layer has a thickness not exceeding the maximum thickness at which a refractive index of a region where light emitted from the active layer is distributed in the ridge structure and under the ridge structure in the lower cladding layer, the active layer, the upper cladding layers, and the etching stop layer is larger by at least 0.007 than the regions on both sides of the region where the emitted light is distributed in the lower cladding layer, the active layer, the upper cladding layers, the buffer layer, and the current blocking layer. Therefore, the light emitted from the active layer is effectively confined in the ridge structure region, whereby a semiconductor laser device having a stable lateral mode can be obtained. In addition, since the buffer layer having reduced crystalline defects is obtained as described above, the current blocking layer grown on the buffer layer also has improved crystalline quality. Consequently, current leakage is suppressed, whereby a semiconductor laser device having a low threshold current and high efficiency can be obtained.

According to a tenth aspect of the present invention, a semiconductor laser device is fabricated by successively forming, on a lower cladding layer comprising a first conductivity type semiconductor, an active layer, a first upper cladding layer comprising second conductivity type AlGaAs, a first etching stop layer comprising second conductivity type $Al_xGa_{1-x}As$ having an Al composition ratio x larger than 0 and not exceeding 0.3, a second etching stop layer comprising second conductivity type $Al_yGa_{1-y}As$ having an Al composition ratio y of 0.6 or more, a second upper cladding layer comprising second conductivity type $Al_zGa_{1-z}As$ having an Al composition ratio z not exceeding 0.6, and a cap layer comprising a second conductivity type semiconductor, removing a portion, except a region of the second upper cladding layer where a current flows, by etching which is stopped when the second etching stop layer is exposed and removing a portion of the second etching stop layer which is exposed by etching stopped when the first etching stop layer is exposed, thereby forming a stripe-shaped ridge structure comprising the remaining regions of the second upper cladding layer and the second etching stop layer. A current blocking layer is formed, burying the portions of the second upper cladding layer and the second etching stop layer which are not removed by the etching. Therefore, since the current blocking layer is grown on the AlGaAs first etching stop layer having a low Al composition ratio (0 to 0.3), three-dimensional growth at the growth surface is suppressed, whereby the current blocking layer has few crystalline defects and good crystalline quality. Consequently, current leakage is suppressed, whereby a semiconductor laser device having a low threshold current and a high efficiency can be obtained.

According to an eleventh aspect of the present invention, in the semiconductor laser device, the first etching stop layer has a thickness smaller than the minimum thickness that causes absorption of light emitted from the active layer. Therefore, the current blocking layer has few crystalline defects and good crystalline quality as described above, whereby current leakage is suppressed, the first etching stop layer is prevented from absorbing the light emitted from the active layer, and a reduction in the light emission efficiency and an increase in the threshold current due to the absorption of the light are suppressed. Consequently, a semiconductor laser device having a low threshold current and a high efficiency can be obtained.

According to a twelfth aspect of the present invention, a method of fabricating a self-aligned structure (SAS) semiconductor laser device having a double heterostructure includes successively forming a first conductivity type AlGaAs lower cladding layer, an AlGaAs active layer, a second conductivity type AlGaAs first upper cladding layer, a second conductivity type $Al_xGa_{1-x}As$ protecting layer having an Al composition ratio x of 0<x<0.3, smaller than that of the first upper cladding layer, and having a thickness at which its band gap energy is equal to or larger than that of the active layer due to a quantum effect, a first conductivity type AlGaAs current blocking layer having an Al composition ratio larger than that of the protecting layer, and a second conductivity type GaAs cap layer on a first conductivity type GaAs substrate, depositing a covering film having a stripe-shaped opening on the GaAs cap layer, using the covering film as a mask, selectively etching the GaAs cap layer and the AlGaAs current blocking layer in the opening of the covering film until a surface of the $Al_xGa_{1-x}As$ protecting layer is exposed to form a stripe-shaped groove, removing the covering film, and successively forming a second conductivity type AlGaAs second upper cladding layer having an Al composition ratio larger than that of the protecting layer and a second conductivity type GaAs contact layer over the entire surface including the inner surface of the stripe-shaped groove. Therefore, even when the $Al_xGa_{1-x}As$ protecting layer is reduced to a thickness at which the band gap energy is equal to or larger than that of the active layer due to the quantum effect, the protecting layer can be made thicker than the GaAs protecting layer in the prior art device, whereby the AlGaAs protecting layer can remain with good controllability even after the etching of the AlGaAs current blocking layer. Further, the AlGaAs second upper cladding layer has few dislocations and good crystalline quality and can be regrown with good reproducibility. Consequently, generation of defects, such as dislocations, in the AlGaAs second upper cladding layer can be suppressed and deterioration of laser characteristics caused by the defects can be prevented.

According to a thirteenth aspect of the present invention, a method of fabricating an SAS semiconductor laser device having a double heterostructure includes successively forming a first conductivity type AlGaAs lower cladding layer, an AlGaAs active layer, a second conductivity type AlGaAs first upper cladding layer, a second conductivity type $Al_xGa_{1-x}As$ protecting layer having an Al composition ratio x of $0<x<0.3$ smaller than that of the first upper cladding layer and having a thickness at which its band gap energy is equal to or larger than that of the active layer due to a quantum effect, a second conductivity type AlGaAs etching stop layer having an Al composition ratio larger than that of the protecting layer, a first conductivity type GaAs current blocking layer, and a second conductivity type GaAs cap layer on a first conductivity type GaAs substrate, depositing a covering film having a stripe-shaped opening on the GaAs cap layer, using the covering film as a mask, selectively etching the GaAs cap layer and the GaAs current blocking layer below the opening of the covering film until a surface of the AlGaAs etching stop layer is exposed, and selectively etching the AlGaAs etching stop layer until a surface of the $Al_xGa_{1-x}As$ protecting layer is exposed to form a stripe-shaped groove, and removing the covering film, and successively forming a second conductivity type AlGaAs second upper cladding layer having an Al composition ratio larger than that of the protecting layer and a second conductivity type GaAs contact layer over the entire surface including the inner surface of the stripe-shaped groove. As described above, since the current blocking layer is an n type GaAs layer and the GaAs current blocking layer is formed on the AlGaAs etching stop layer, the GaAs current blocking layer can be selectively removed by an etchant having a sufficiently large selectivity ratio with respect to the AlGaAs etching stop layer, whereby reproducibility and stability of the etching can be improved. In addition, the protecting layer is thicker than the GaAs protecting layer in the prior art device as in the twelfth aspect of the invention and the AlGaAs etching stop layer is much thinner than the current blocking layer. Therefore, when the etching stop layer is etched selectively with respect to the p type AlGaAs protecting layer having an Al composition ratio smaller than that of the etching stop layer, the etching time is shortened and there is a further reduced possibility that the protecting layer will be etched simultaneously with the etching of the etching stop layer, as compared with that in the twelfth aspect of the invention. Accordingly, the AlGaAs protecting layer can remain with good controllability even after the etching of the etching stop layer. Further, the AlGaAs second upper cladding layer has few dislocations and good crystalline quality and can be regrown with good reproducibility. Consequently, generation of defects, such as dislocations, in the AlGaAs second upper cladding layer can be suppressed and deterioration of laser characteristics caused by the defects can be prevented more effectively than in the twelfth aspect of the invention.

According to a fourteenth aspect of the present invention, in fabricating a semiconductor laser device, after the formation of a stripe-shaped groove, a second conductivity type AlGaAs buffer layer having an Al composition ratio smaller than that of the AlGaAs second upper cladding layer is formed over the entire surface before the AlGaAs second upper cladding layer and the GaAs contact layer are successively formed. As described above, since the AlGaAs second upper cladding layer having a composition ratio of Al having a migration length longer than that of the protecting layer is not regrown directly on the AlGaAs protecting layer but is grown on the AlGaAs buffer layer having an Al composition ratio smaller than that of the second upper cladding layer, after the buffer layer is regrown on the protecting layer, generation of dislocations in the buffer layer is suppressed more than in the second upper cladding layer when the second upper cladding layer is regrown directly on the protecting layer. Therefore, generation of defects, such as dislocations, in the AlGaAs second upper cladding layer and the GaAs contact layer, which are grown above the buffer layer, is suppressed and deterioration of laser characteristics caused by the defects can be prevented more effectively than in the twelfth or thirteenth aspects of the invention.

According to a fifteenth aspect of the present invention, in fabricating a semiconductor laser device, after the formation of the stripe-shaped groove, the $Al_{1-x}Ga_xAs$ protecting layer is cleaned in the vapor phase before the AlGaAs second upper cladding layer and the GaAs contact layer are successively formed thereon. Therefore, a layer including dopant impurities, which exist on the surface of the protecting layer, is removed, whereby generation of defects, such as dislocations, in the AlGaAs second upper cladding layer and the GaAs contact layer, which are grown above the protecting layer, is suppressed and deterioration of laser characteristics caused by the defects can be prevented more effectively than when no cleaning is performed.

According to a sixteenth aspect of the present invention, in fabricating a semiconductor laser device, after the formation of the stripe-shaped groove, a surface of the $Al_{1-x}Ga_xAs$ protecting layer is cleaned in the vapor phase before the AlGaAs buffer layer is formed thereon. Therefore, a layer including dopant impurities, on the surface of the protecting layer, is removed, whereby generation of defects, such as dislocations, in the AlGaAs buffer layer, the AlGaAs second upper cladding layer, and the GaAs contact layer which are grown above the protecting layer is suppressed and deterioration of laser characteristics caused by the defects can be prevented more effectively than when no cleaning is performed.

According to a seventeenth aspect of the present invention, an SAS semiconductor laser device having a double heterostructure is fabricated by successively forming a first conductivity type AlGaAs lower cladding layer, an AlGaAs active layer, a second conductivity type AlGaAs first upper cladding layer opposite to the first conductivity type, a second conductivity type $Al_xGa_{1-x}As$ protecting layer having an Al composition ratio x of 0<x<0.3 smaller than that of the first upper cladding layer and having a thickness at which a band gap energy is equal to or larger than that of the active layer due to a quantum effect, a first conductivity type AlGaAs current blocking layer having an Al composition ratio larger than that of the protecting layer, and a second conductivity type GaAs cap layer on a first conductivity type GaAs substrate, selectively etching the GaAs cap layer and the AlGaAs current blocking layer in a stripe-shaped region until a surface of the $Al_xGa_{1-x}As$ protecting layer is exposed, thereby forming a stripe-shaped groove, and successively forming a second conductivity type AlGaAs second upper cladding layer having an Al composition ratio larger than that of the protecting layer and a second conductivity type GaAs contact layer over the entire surface including the inner surface of the stripe-shaped groove. Therefore, even when the $Al_xGa_{1-x}As$ protecting layer is reduced to a thickness at which its band gap energy is equal to or larger than that of the active layer due to the quantum effect, the protecting layer can be made thicker than the GaAs protecting layer in the prior art device, whereby the AlGaAs protecting layer can remain with good controllability even after the etching of the AlGaAs current blocking layer. Further, the AlGaAs second upper cladding layer has few dislocations and good crystalline quality and can be regrown with good reproducibility. Consequently, generation of defects, such as dislocations, in the AlGaAs second upper cladding layer can be suppressed and deterioration of laser characteristics caused by the defects can be prevented.

According to an eighteenth aspect of the present invention, an SAS semiconductor laser device having a double heterostructure is fabricated by successively forming a first conductivity type AlGaAs lower cladding layer, an AlGaAs active layer, a second conductivity type AlGaAs first upper cladding layer, a second conductivity type $Al_xGa_{1-x}As$ protecting layer having an Al composition ratio x of 0<x<0.3, smaller than that of the first upper cladding layer, and having a thickness at which the band gap energy is equal to or larger than that of the active layer due to the quantum effect, a second conductivity type AlGaAs etching stop layer having an Al composition ratio larger than that of the protecting layer, a first conductivity type GaAs current blocking layer, and a second conductivity type GaAs cap layer on a first conductivity type GaAs substrate, selectively etching the GaAs cap layer and the GaAs current blocking layer in a stripe-shaped region until a surface of the AlGaAs etching stop layer is exposed and selectively etching the AlGaAs etching stop layer until a surface of the $Al_xGa_{1-x}As$ protecting layer is exposed, thereby forming a stripe-shaped groove. A second conductivity type AlGaAs second upper cladding layer having an Al composition ratio larger than that of the protecting layer and a second conductivity type GaAs contact layer are successively formed over the entire surface including the inner surface of the stripe-shaped groove. As described above, since the current blocking layer is an n type GaAs layer and the GaAs current blocking layer is formed on the AlGaAs etching stop layer, the GaAs current blocking layer can be selectively removed by etching having a sufficiently large selectivity ratio with respect to the AlGaAs etching stop layer, whereby reproducibility and stability of the etching can be improved. In addition, the protecting layer is made thicker than the GaAs protecting layer in the prior art device as in the seventeenth aspect of the invention and the AlGaAs etching stop layer is much thinner than the current blocking layer. Therefore, when the etching stop layer is etched selectively with respect to the p type AlGaAs protecting layer having an Al composition ratio smaller than that of the etching stop layer, the etching time is shortened and there is a further reduced possibility that the protecting layer can be etched simultaneously with the etching of the etching stop layer, as compared with the seventeenth aspect of the invention. Accordingly, the AlGaAs protecting layer can remain with good controllability even after the etching of the etching stop layer. Further, the AlGaAs second upper cladding layer has few dislocations and good crystalline quality and can be regrown with good reproducibility. Consequently, generation of defects, such as dislocations, in the AlGaAs second upper cladding layer can be suppressed and deterioration of laser characteristics, caused by the defects, can be prevented more than in the seventeenth aspect.

According to a nineteenth aspect of the present invention, in the semiconductor laser device, after the formation of the stripe-shaped groove, a second conductivity type AlGaAs buffer layer having an Al composition ratio smaller than that of the AlGaAs second upper cladding layer is formed over the entire surface before the AlGaAs second upper cladding layer is formed. Since the AlGaAs second upper cladding layer having a composition ratio of Al having a migration length longer than that of the protecting layer is not regrown directly on the AlGaAs protecting layer, but is grown on the AlGaAs buffer layer having an Al composition ratio smaller than that of the second upper cladding layer after the buffer layer is regrown on the protecting layer, generation of dislocations in the buffer layer is suppressed more than that in the second upper cladding layer when the second upper cladding layer is regrown directly on the protecting layer. Therefore, generation of defects, such as dislocations, in the AlGaAs second upper cladding layer and the GaAs contact layer which are grown above the buffer layer can be suppressed and deterioration of laser characteristics, caused by the defects, can be prevented more effectively than in the seventeenth or eighteenth aspect of the invention.

BRIEF DESCRIPTION OF THE DRAWINGS

FIGS. 4(a1), 4(a2), 4(b1), and 4(b2) are microphotographs showing the surface morphology of a current blocking layer and etch pits which are produced by etching the surface of the current blocking layer using molten KOH, observed with an optical microscope, of the specimen (a) formed by the method of the first embodiment and of the specimen (b) formed by the prior art method shown in FIGS. 18(a)–18(e), respectively.

DETAILED DESCRIPTION OF THE PREFERRED EMBODIMENTS

[Embodiment 1]

Structure 1

Figure 1:
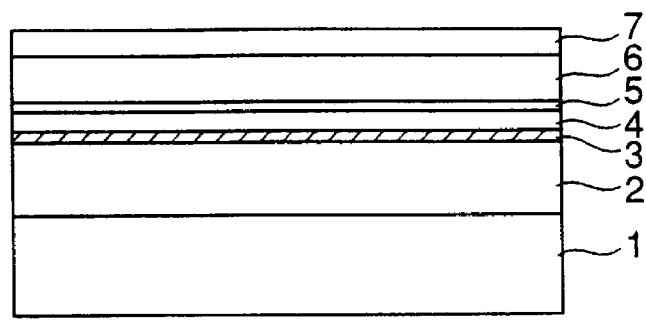
FIGS. 1(a)–1(d) are sectional views illustrating process steps in a method of fabricating a buried ridge semiconductor laser device in accordance with a first embodiment of the present invention.
Figure 1:
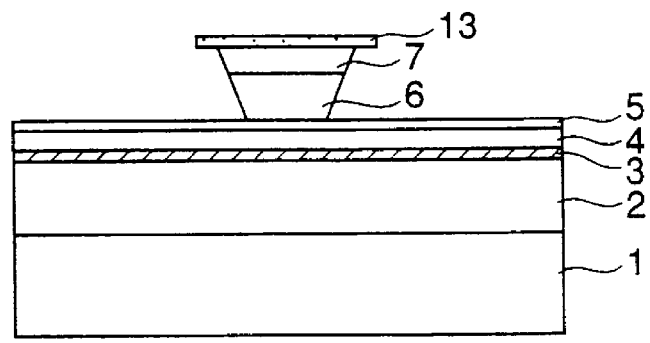
Figure 1:
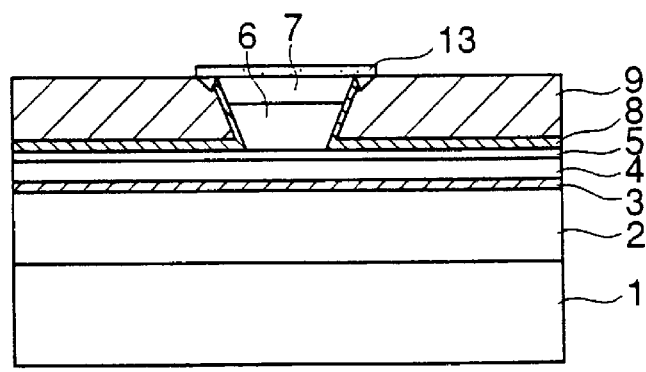
Figure 1:
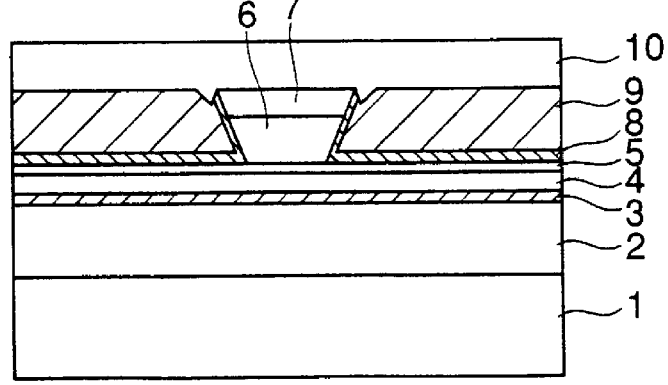

In a method of fabricating a semiconductor laser device according to a first embodiment of the present invention, as shown in FIGS. 1(a)–1(d), an active layer 3, and upper cladding layers 4, 5, and 6 are successively formed on a lower cladding layer 2. The upper cladding layers 4, 5, and 6 are selectively etched to form a stripe-shaped ridge structure, and a buffer layer 8 comprising $Al_xGa_{1-x}As$, having an Al composition ratio x of 0 to 0.3, is formed on a surface of the upper cladding layers 4, 5, and 6, exposed by etching. A current blocking layer 9 comprising first conductivity type $Al_yGa_{1-y}As$ having an Al composition ratio y of 0.5 or more is formed on the buffer layer 8 to bury portions of the upper cladding layers 4, 5, and 6 that were left after the etching. Therefore, since the layer grown first on the surface of the upper cladding layers 4, 5, and 6 that is exposed by the etching for forming the ridge structure is selected from AlGaAs and GaAs having a low Al composition ratio (0–0.3), three-dimensional growth at the growth surface of the buffer layer 8 is suppressed, whereby the buffer layer 8 having reduced crystalline defects is formed. Accordingly, the AlGaAs current blocking layer 9 grown subsequently also has reduced crystalline defects and good crystalline quality. Consequently, current leakage is suppressed, whereby a semiconductor laser device having a low threshold current and a high efficiency can be fabricated with a stable yield.

Structure 2

In the method of fabricating a semiconductor laser device of the structure 1, as shown in FIGS. 1(a)–1(d), the upper cladding layers 4, 5, and 6 comprise a first upper cladding layer 4, an etching stop layer 5 comprising $Al_zGa_{1-z}As$ having an Al composition ratio z of 0.6 or more, and a second upper cladding layer 6 comprising $Al_wGa_{1-w}As$ having an Al composition ratio w not exceeding 0.6, successively laminated on the active layer 3. The stripe-shaped ridge structure is formed by removing a portion, but not a region of the second upper cladding layer 6 where a current flows, by selective etching which is stopped when a surface of the etching stop layer 5 is exposed. Therefore, stability and reproducibility in forming the ridge structure are improved. In addition, since the layer grown first on the exposed surface of the etching stop layer 5 and at a side surface of the ridge structure comprises one selected from AlGaAs and GaAs having a low Al composition ratio (0–0.3), three-dimensional growth at the growth surface of the buffer layer 8 was suppressed, whereby the buffer layer 8 having reduced crystalline defects is formed. Accordingly, the AlGaAs current blocking layer 9 grown subsequently thereto also becomes a crystalline layer having reduced crystalline defects and good crystalline quality. Consequently, current leakage is suppressed, whereby a semiconductor laser device having a low threshold current and a high efficiency can be fabricated with a stable yield.

Structure 3

In the method of fabricating a semiconductor laser device of structure 1 or 2, as shown in FIGS. 1(a)–1(d), the buffer layer 8 has a thickness at which the refractive index of a region where light emitted from the active layer 3 is distributed in the ridge structure, and under the ridge structure, i.e., in the lower cladding layer 2, the active layer 3, the upper cladding layers 4 and 6, and the etching stop layer 5, is larger than the refractive indices of regions on both sides of the region where the emitted light is distributed in the lower cladding layer 2, the active layer 3, the upper cladding layers 4 and 6, the buffer layer 8, and the current blocking layer 9, by at least 0.007. Therefore, the light emitted from the active layer 3 is effectively confined in the ridge structure region, whereby a semiconductor laser device having a stable lateral mode can be fabricated. In addition, since the buffer layer 8 having a reduced density of crystalline defects is obtained as described above, the current blocking layer 9 grown on the buffer layer 8 also has improved crystalline quality. Consequently, current leakage is suppressed, whereby a semiconductor laser device having a low threshold current and a high efficiency can be fabricated with a stable yield.

Structure 4

In the method of fabricating a semiconductor laser device of any of structures 1 to 3, as shown in FIGS. 1(a)–1(d), the buffer layer 8 comprises $Al_xGa_{1-x}As$ having an Al composition ratio x of 0 to 0.3 grown at a growth temperature of 300° C. to 500° C. Therefore, in the growth of the buffer layer 8, three-dimensional growth at the surface of the buffer layer 8 is suppressed, whereby the buffer layer 8 has a reduced density of crystalline defects. Accordingly, the AlGaAs current blocking layer 9 grown subsequently also has fewer crystalline defects and good crystalline quality. Consequently, current leakage is suppressed, whereby a semiconductor laser device having a low threshold current and a high efficiency can be fabricated with a stable yield.

Structure 5

A semiconductor laser device according to the first embodiment of the present invention is fabricated, as shown in FIGS. 1(a)–1(d) and 2, by successively forming an active layer 3, and upper cladding layers 4, 5, and 6 on a lower cladding layer 2, selectively etching the upper cladding layers 4, 5, and 6 to form a stripe-shaped ridge structure, and forming a buffer layer 8 comprising $Al_xGa_{1-x}As$ having an Al composition ratio x of 0 to 0.3 which is grown on a surface of the upper cladding layers 4, 5, and 6 exposed by the etching. A current blocking layer 9 comprising first conductivity type $Al_yGa_{1-y}As$ having an Al composition ratio y of at least 0.5 is grown on the buffer layer 8 to bury portions of the upper cladding layers 4, 5, and 6 which are exposed by etching. Therefore, since the layer grown first on the surface of the upper cladding layers 4, 5, and 6, which is exposed by etching, for forming the ridge structure comprises one selected from AlGaAs and GaAs having a low Al composition ratio (0–0.3), and three-dimensional growth at the growth surface of the buffer layer 8 is suppressed, whereby the buffer layer 8 has a reduced density of crystalline defects. Accordingly, the AlGaAs current blocking layer 9 grown subsequently also has reduced crystalline defects and good crystalline quality. Consequently, current leakage is suppressed, whereby a semiconductor laser device having a low threshold current and a high efficiency is obtained.

Structure 6

In the semiconductor laser device of the structure 5, as shown in FIGS. 1(a)–1(d) and 2, the upper cladding layers 4, 5, and 6 comprise a first upper cladding layer 4, an etching stop layer 5 comprising $Al_zGa_{1-z}As$ having an Al composition ratio z of 0.6 or more, and a second upper cladding layer 6 comprising $Al_wGa_{1-w}As$ having an Al composition ratio w not exceeding 0.6, successively laminated on the active layer 3. The stripe-shaped ridge structure is formed by removing a portion of the second upper cladding layer 6 where a current flows, by selective etching which is stopped when a surface of the etching stop layer 5 is exposed. Therefore, since the layer grown first on the exposed surface of the etching stop layer 5 and at a side surface of the ridge structure comprises one selected from AlGaAs and GaAs having a low Al composition ratio (0–0.3), three-dimensional growth at the growth surface of the buffer layer 8 is suppressed, whereby the buffer layer 8 having a reduced density of crystalline defects is formed. Accordingly, the AlGaAs current blocking layer 9 grown subsequently also has a reduced density of crystalline defects and good crystalline quality. Consequently, current leakage is suppressed, whereby a semiconductor laser device having a low threshold current and a high efficiency can be obtained.

Structure 7

In the semiconductor laser device of structure 5 or 6, as shown in FIGS. 1(a)–1(d) and 2, the buffer layer 8 has a thickness at which the refractive index of a region where light emitted from the active layer 3 is distributed in the ridge structure, and under the ridge structure, i.e., in the lower cladding layer 2, the active layer 3, the upper cladding layers 4 and 6, and the refractive index of the etching stop layer 5, is larger than the refractive indices of regions on both sides of the region where the emitted light is distributed in the lower cladding layer 2, the active layer 3, the upper cladding layers 4 and 6, the buffer layer 8, and the current blocking layer 9, by at least 0.007. Therefore, because of this quantum effect, the light emitted from the active layer 3 is effectively confined in the ridge structure region, whereby a semiconductor laser device having a stable lateral mode can be obtained. In addition, since the buffer layer 8 has reduced crystalline defects, as described above, the current blocking layer 9 grown on the buffer layer 8 also has improved crystalline quality. Consequently, current leakage is suppressed, whereby a semiconductor laser device having a low threshold current and a high efficiency can be obtained.

Embodiment 1

FIGS. 1(a)–1(d) are sectional views illustrating process steps in a method of fabricating a buried ridge semiconductor laser device according to the first embodiment of the invention. Initially, as shown in FIG. 1(a), an n type $Al_{0.5}Ga_{0.5}As$ lower cladding layer 2 having a thickness of 1.5 $\mu$m, an $Al_{0.1}Ga_{0.9}As$ active layer 3 having a thickness of 15 nm, a p type $Al_{0.5}Ga_{0.5}As$ first upper cladding layer 4 having a thickness of 0.1 $\mu$m, a p type $Al_{0.7}Ga_{0.3}As$ etching stop layer 5 having a thickness of 20 nm, a p type $Al_{0.5}Ga_{0.5}As$ second upper cladding layer 6 having a thickness of 1.4 $\mu$m, and a p type GaAs cap layer 7 having a thickness of 0.5 $\mu$m are successively epitaxially grown on an n type GaAs substrate 1 by metal organic chemical vapor deposition (hereinafter referred to as MOCVD). Next, after an SiON film having a thickness of 50 nm is deposited over the entire surface of the p type GaAs cap layer 7 by CVD, an SiON film 13 is formed on a stripe-shaped region of the p type GaAs cap layer 7 using photolithographic and etching techniques. Further, as shown in FIG. 1(b), using the SiON film 13 as a mask, the p type GaAs cap layer 7 and the p type $Al_{0.5}Ga_{0.5}As$ second upper cladding layer 6 are selectively etched using an etchant comprising a mixture of tartaric acid and hydrogen peroxide. This etching is stopped automatically when a surface of the p type $Al_{0.7}Ga_{0.3}As$ etching stop layer 5 is exposed. In this way, a ridge structure comprising the second upper cladding layer 6 and the cap layer 7 is formed.

Figure 2:
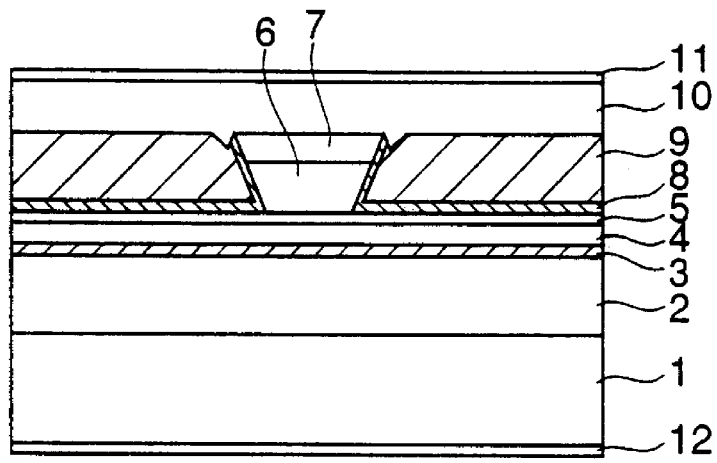
FIG. 2 is a sectional view illustrating a buried ridge semiconductor laser device in accordance with the first embodiment of the invention.

In the step of FIG. 1(c), an n type GaAs buffer layer 8 having a thickness of 20 nm and an n type $Al_{0.7}Ga_{0.3}As$ current blocking layer 9 having a thickness of 1.9 μm are successively grown by MOCVD on the exposed surface of the etching stop layer 5 and at a side surface of the ridge structure to bury the portions of the cap layer 7 and the second upper cladding layer 6 that are not removed by the etching. Then, as shown in FIG. 1(d), after removing the SiON film 13, a p type GaAs contact layer 10 having a thickness of 2.5 μm is epitaxially grown by MOCVD over the entire surface. Finally, after the n type GaAs substrate 1 is ground to a thickness of about 100 μm, a front surface electrode 11 is formed on a surface of the contact layer 10 and a rear surface electrode 12 is formed at the rear surface of the GaAs substrate 1, followed by forming laser facets and separating chips by a method such as cleaving, resulting in a buried ridge semiconductor laser device as shown in FIG. 2.

In the first embodiment of the invention, the GaAs buffer layer 8 is grown on the surface of the $Al_{0.7}Ga_{0.3}As$ etching stop layer 5. Since the migration length of Ga is longer than that of Al at the epitaxial growth surface as described above, the GaAs buffer layer 8 becomes the grown layer having fewer crystalline defects, such as dislocations, and better crystalline quality than the $Al_{0.7}Ga_{0.3}As$ current blocking layer in the prior art device. Further, the n type GaAs buffer layer 8 does not include Al and the surface is not exposed to the air. Therefore, when the n type $Al_{0.7}Ga_{0.3}As$ current blocking layer 9 is grown on the buffer layer 8, three-dimensional growth is suppressed, whereby a current blocking layer having fewer crystalline defects, such as dislocations, and better crystalline quality can be obtained.

Figure 3:
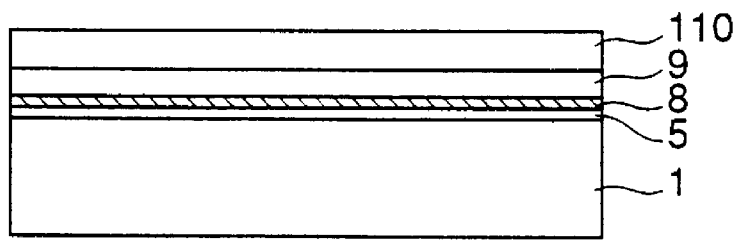
FIGS. 3(a) and 3(b) are sectional views respectively illustrating a laminated structure comprising a GaAs buffer layer, an $Al_{0.7}Ga_{0.3}As$ current blocking layer, and a GaAs layer for evaluating dislocation density on a surface of an $Al_{0.7}Ga_{0.3}As$ etching stop layer which is exposed to air, and a laminated structure comprising an $Al_{0.7}Ga_{0.3}As$ current blocking layer and a GaAs layer for evaluating dislocation density on a surface of an $Al_{0.7}Ga_{0.3}As$ etching stop layer which is exposed to air.
Figure 3:
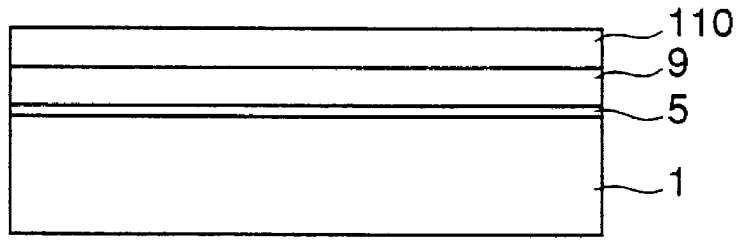

In order to confirm the above-described effects directly, as shown in FIG. 3(a), the p type $Al_{0.7}Ga_{0.3}As$ etching stop layer 5 is grown on the GaAs substrate 1, the n type GaAs buffer layer 8 and the n type $Al_{0.7}Ga_{0.3}As$ current blocking layer 9 are successively grown on the surface of the etching stop layer 5 after its exposure to air as in the first embodiment of the invention, and a GaAs layer 110 for evaluating dislocation density is grown thereon, thereby forming a specimen (a). As shown in FIG. 3(b), the p type $Al_{0.7}Ga_{0.3}As$ etching stop layer 5 is grown on the GaAs substrate 1, the n type $Al_{0.7}Ga_{0.3}As$ current blocking layer 9 is grown directly on the etching stop layer 5 after its exposure to air, as in the prior art fabricating method shown in FIGS. 18(a)–18(e), and the GaAs layer 110 for evaluating dislocation density is grown, thereby forming a specimen (b).

In the specimens (a) and (b), surface morphology of the GaAs layers 110 for evaluating dislocation density and etch pits, produced by etching the surfaces using molten KOH, are observed with an optical microscope. Since etch pits correspond to dislocation ends which appear on a crystalline surface, the dislocation density can be determined by counting the number of etch pits per unit area. It is thought that the surface morphology and the etch pits of the GaAs layer 110 for evaluating dislocation density reflect the surface morphology and the dislocation density of the current blocking layer 9.

FIGS. 4(a1), 4(a2), 4(b1) and 4(b2) show the results of the observation with an optical microscope. FIG. 4(a1) shows the surface morphology and FIG. 4(a2) shows the etch pits of the current blocking layer 9 of the specimen (a) formed by the fabricating method of the first embodiment and FIGS. 4(b1) and 4(b2) show those of the specimen (b) formed by the prior art fabricating method shown in FIGS. 18(a)–18(e). These figures prove that the surface morphology and the etch pits (dislocation density) of the current blocking layer 9 of the specimen (a) are much different from those of the specimen (b). More specifically, the surface morphology of the specimen (b) according to the first embodiment is improved over the prior art device, and while the dislocation density of the prior art specimen is over $1\times10^8$ $cm^{-2}$, the dislocation density of the specimen (b) in the first embodiment is reduced to about $1\times10^5$ $cm^{-2}$.

As described above, by employing the fabrication method according to the first embodiment of the invention, a semiconductor laser device can be fabricated in which the crystalline defects, such as dislocations, of the current blocking layer 9 are reduced, and leakage current caused by crystalline defects is suppressed, achieving a low threshold current and a high efficiency.

In addition, although the temperature in the growth of the semiconductor layers by MOCVD is usually from 600° C. to 750° C., by growing the GaAs buffer layer 8 at a growth temperature of 300° C. to 500° C., three-dimensional growth at the growth surface of the buffer layer is further suppressed. Thereby, crystalline defects, such as dislocations, of the GaAs buffer layer 8 and the AlGaAs current blocking layer 9 grown on the buffer layer can be reduced, and the current leakage caused by the crystalline defects can be further suppressed.

Figure 5:
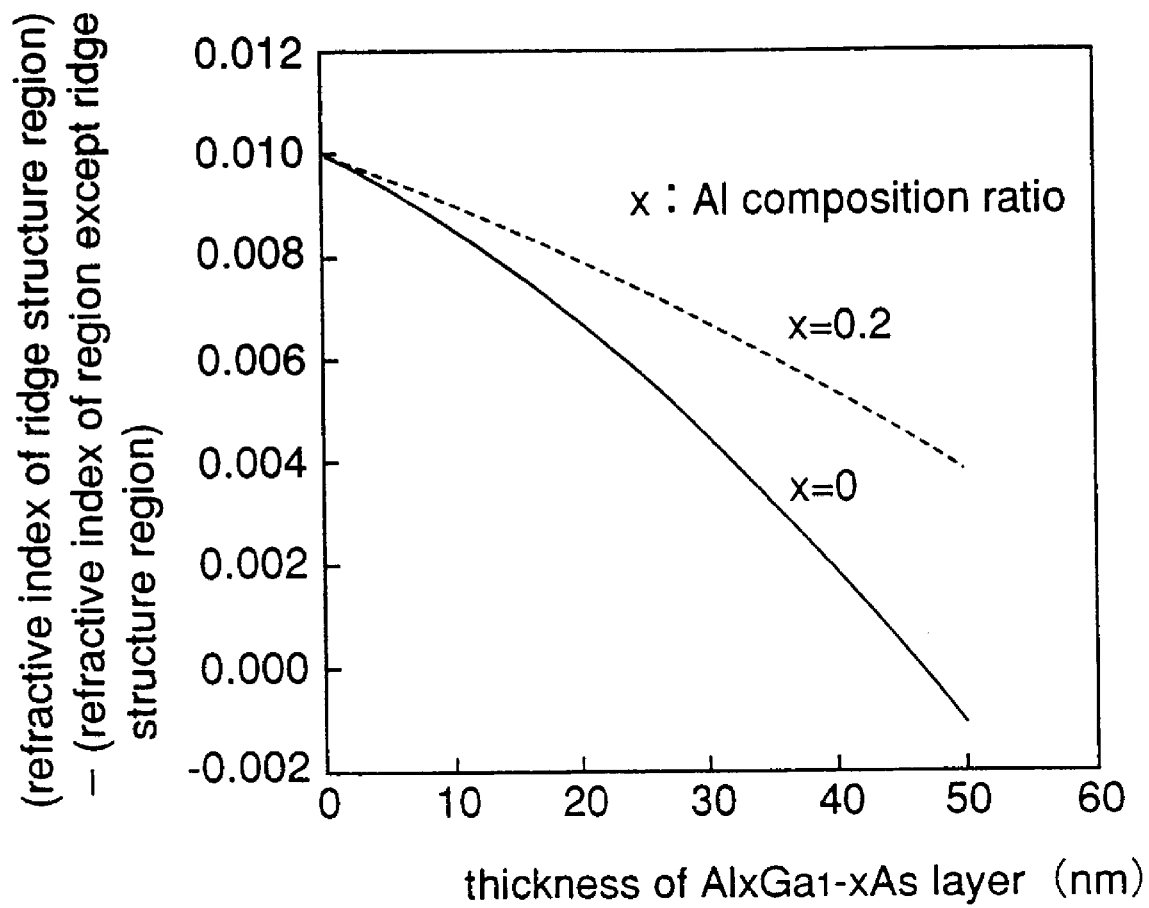
FIG. 5 is a graph showing a relation between the thickness of an $Al_xGa_{1-x}As$ buffer layer having an Al composition ratio x of 0 (0.2) and a difference between a refractive index of a ridge structure region and refractive indices of regions, except the ridge structure region, according to the first embodiment of the invention.

In order that the light emitted from the active layer be effectively confined in a ridge structure region, it is necessary that the buffer layer 8 have a thickness not exceeding the maximum thickness at which the refractive index of a region where light emitted from the active layer 3 is distributed in the ridge structure, and under the ridge structure (in the lower cladding layer 2, the active layer 3, the upper cladding layers 4 and 6, and the etching stop layer 5), be larger by at least 0.007 than the refractive indices of regions on both sides of the region where the emitted light is distributed. In the first embodiment of the invention, the GaAs buffer layer 8 is formed on each side of the ridge structure, and the refractive indices of those regions, except the ridge structure region, depend on the thickness of the GaAs buffer layer 8. FIG. 5 shows a relation between a difference between the refractive index of the ridge structure region and the refractive indices of the regions, except the ridge structure region, and the thickness of the GaAs buffer layer. As seen from a curved line of Al composition ratio x=0 in the figure, the thickness of the GaAs buffer layer is required to be smaller than 20 nm so that the difference between the refractive index inside and outside the ridge structure region is 0.007 or more. Since the thickness of the n type GaAs buffer layer 8 in the first embodiment is 20 nm, the condition of the refractive index is satisfied. Therefore, the light emitted from the active layer is effectively confined in the ridge structure region, whereby a semiconductor laser device having a stable lateral mode can be obtained.

$Al_xGa_{1-x}As$ having an Al composition ratio x (0<x<0.3) may be used for the buffer layer 8 in place of GaAs. Also in this case, the same effects as described above are achieved concerning the growth of the current blocking layer. However, since the refractive indices of the regions, except the ridge structure region, are smaller than when GaAs is used for the buffer layer, the maximum thickness of the buffer layer for confining effectively the light in the ridge structure region becomes over 20 nm. For example, in a case of an Al composition ratio x=0.2, the maximum thickness becomes about 28 nm as shown in a broken line in FIG. 5. Consequently, control of the layer thickness in the process for growing the buffer layer is facilitated.

The conductivity type of the buffer layer 8 may not be n type but may be p type. Further, the buffer layer 8 may be a high resistance layer.

While the upper and lower cladding layers comprise $Al_{0.5}Ga_{0.5}As$, these layers may comprise other semiconductors, such as InGaP. While the active layer comprises $Al_{0.1}Ga_{0.9}As$ and has a single layer structure, the layer may comprise other semiconductors, such as GaAs and InGaAs, and may have a multilayer structure, such as a multiple quantum well structure.

While the etching stop layer comprises $Al_{0.7}Ga_{0.3}As$, other semiconductors having the same function may be used. Further, in a method of fabricating a semiconductor laser device without using the etching stop layer, when the current blocking layer comprises $Al_xGa_{1-x}As$ having an Al composition ratio x ($x \geq 0.5$), the same effects are achieved by using the buffer layer shown in the first embodiment.

In addition, the etchant used in the etching step for forming the ridge structure may not be a mixture of tartaric acid and hydrogen peroxide but may be a mixture of another organic acid, such as citric acid, and hydrogen peroxide.

[Embodiment 2]
Structure 1

In a method of fabricating a semiconductor laser device according to a second embodiment of the present invention, as shown in FIGS. 6(a)–6(d), an active layer 3, a first upper cladding layer 4 comprising AlGaAs, a first etching stop layer 14 comprising $Al_xGa_{1-x}As$ having an Al composition ratio x larger than 0 and not exceeding 0.3, a second etching stop layer 15 comprising $Al_yGa_{1-y}As$ having an Al composition ratio y of 0.6 or more, a second upper cladding layer 6 comprising $Al_zGa_{1-z}As$ having an Al composition ratio z not exceeding 0.6, and a cap layer 7 are successively formed on a lower cladding layer 2. A portion, except a region of the second upper cladding layer 6 where a current flows, is removed by selective etching which is stopped when a surface of the second etching stop layer 15 is exposed. The portion of the second etching stop layer 15 which is exposed is removed by selective etching which is stopped when a surface of the first etching stop layer 14 is exposed. A stripe-shaped ridge structure comprising the remaining regions of the second upper cladding layer 6 and the second etching stop layer 15, and a current blocking layer 9, is formed to bury the portions of the second upper cladding layer 6 and the second etching stop layer 15 which are left after etching. Therefore, since the current blocking layer 9 is grown on the AlGaAs first etching stop layer 14 having a low Al composition ratio (0 to 0.3), three-dimensional growth is suppressed, whereby the current blocking layer 9 becomes a crystalline layer having few crystalline defects and good crystalline quality. Consequently, current leakage is suppressed, whereby a semiconductor laser device having a low threshold current and a high efficiency can be fabricated with a stable yield.

Structure 2

In the method of fabricating a semiconductor laser device of the structure 1, as shown in FIGS. 6(a)–6(d), the first etching stop layer 14 has a thickness smaller than the minimum of thicknesses that cause absorption of light emitted from the active layer 3. The current blocking layer 9 has few crystalline defects and good crystalline quality as described above, whereby current leakage, a reduction in the laser efficiency, and an increase in the threshold current are suppressed since the first etching stop layer 14 is prevented from absorbing the light emitted from the active layer 3. Consequently, a semiconductor laser device having a low threshold current and a high efficiency can be fabricated with a stable yield.

Structure 3

A semiconductor laser device according to the second embodiment of the present invention is fabricated as shown in FIGS. 6(a)–6(d) and 7 by successively forming an active layer 3, a first upper cladding layer 4 comprising AlGaAs, a first etching stop layer 14 comprising $Al_xGa_{1-x}As$ having an Al composition ratio x larger than 0 and not exceeding 0.3, a second etching stop layer 15 comprising $Al_yGa_{1-y}As$ having an Al composition ratio y of 0.6 or more, a second upper cladding layer 6 comprising $Al_zGa_{1-z}As$ having an Al composition ratio z not exceeding 0.6, and a cap layer 7 on a lower cladding layer 2. Thereafter a portion, except a region of the second upper cladding layer 6 where a current flows, is removed by selective etching which is stopped when a surface of the second etching stop layer 15 is exposed. A portion of the second etching stop layer 15 which is exposed is removed by selective etching which is stopped when a surface of the first etching stop layer 14 is exposed, thereby forming a stripe-shaped ridge structure comprising the remaining regions of the second upper cladding layer 6 and the second etching stop layer 15. A current blocking layer 9 is formed to bury the portions of the second upper cladding layer 6 and the second etching stop layer 15 which are left after etching. Therefore, since the current blocking layer 9 is grown on the AlGaAs first etching stop layer 14 having a low Al composition ratio (larger than 0 and smaller than 0.3), three-dimensional growth is suppressed, whereby the current blocking layer 9 becomes a crystalline layer having few crystalline defects and good crystalline quality. Consequently, current leakage is suppressed, whereby a semiconductor laser device having a low threshold current and a high efficiency can be obtained.

Structure 4

In the semiconductor laser device of the structure 3, as shown in FIGS. 6(a)–6(d) and 7, the first etching stop layer 14 has a thickness smaller than the minimum thickness that causes absorption of light emitted from the active layer 3. Therefore, the current blocking layer 9 has few crystalline defects and good crystalline quality as described above, whereby current leakage is suppressed, the first etching stop layer 14 can be prevented from absorbing the light emitted from the active layer 3, and a reduction in the light emission efficiency and an increase in the threshold current due to the absorption of the light can be suppressed. Consequently, a semiconductor laser device having a low threshold current and a high efficiency can be obtained.

Embodiment 2

Figure 6:
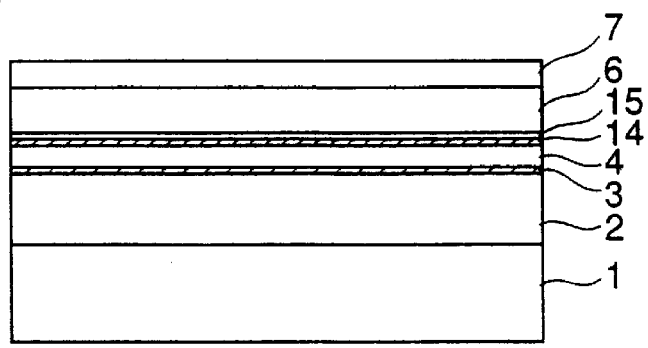
FIGS. 6(a)–6(d) are sectional views illustrating process steps in a method of fabricating a buried ridge semiconductor laser device in accordance with a second embodiment of the present invention.
Figure 6:
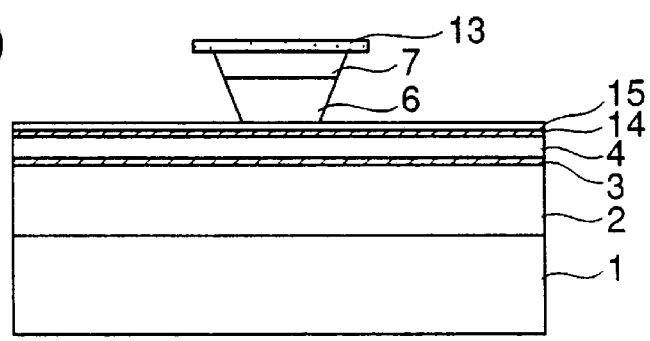
Figure 6:
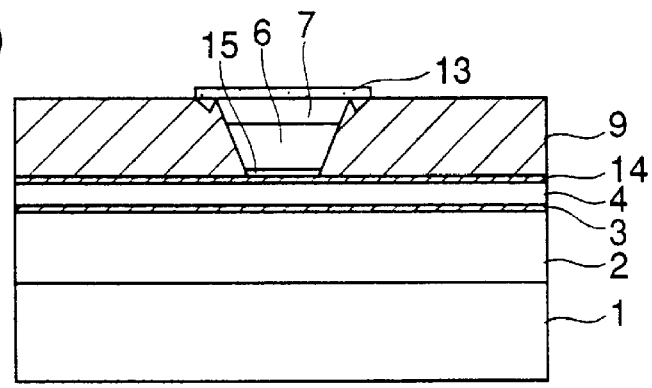
Figure 6:
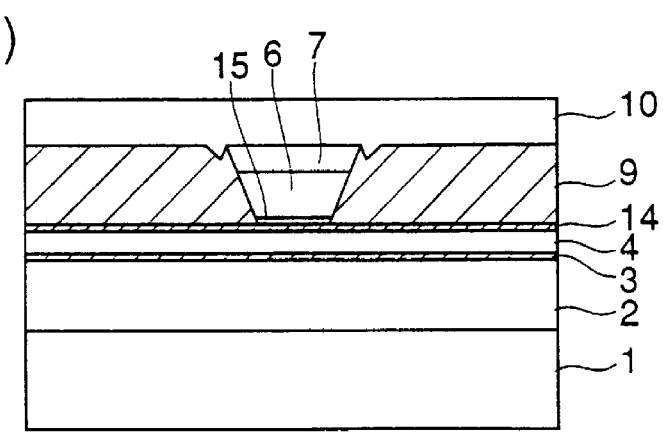

FIGS. 6(a)–6(d) are sectional views illustrating process steps in a method of fabricating a buried ridge semiconductor laser device according to the second embodiment of the invention. Initially, as shown in FIG. 6(a), an n type $Al_{0.5}Ga_{0.5}As$ lower cladding layer 2 having a thickness of 1.5 μm, an $Al_{0.1}Ga_{0.9}As$ active layer 3 having a thickness of 15 nm, a p type $Al_{0.5}Ga_{0.5}As$ first upper cladding layer 4 having a thickness of 0.1 μm, a p type $Al_{0.1}Ga_{0.9}As$ first etching stop layer 14 having a thickness of 10 nm, a p type $Al_{0.7}Ga_{0.3}As$ second etching stop layer 15 having a thickness of 20 nm, a p type $Al_{0.5}Ga_{0.5}As$ second upper cladding layer 6 having a thickness of 1.4 μm, and a p type GaAs cap layer 7 having a thickness of 0.5 μm are successively epitaxially grown on an n type GaAs substrate 1 by MOCVD. Next, after an SiON film having a thickness of 50 nm is deposited over the entire surface of the p type GaAs cap layer 7, using CVD, photolithography, and etching, an SiON film 13 is left on a stripe-shaped region of the p type GaAs cap layer 7. Further, as shown in FIG. 6(b), using the SiON film 13 as a mask, the p type GaAs cap layer 7 and the p type $Al_{0.5}Ga_{0.5}As$ second upper cladding layer 6 are selectively etched using an etchant comprising a mixture of tartaric acid and hydrogen peroxide. This etching is stopped automatically when a surface of the p type $Al_{0.7}Ga_{0.3}As$ second etching stop layer 15 is exposed.

In the step of FIG. 6(c), a region of the exposed surface of the second etching stop layer 15 is selectively etched using hydrochloric acid. This etching is stopped automatically when a surface of the p type $Al_{0.1}Ga_{0.9}As$ first etching stop layer 14 is exposed. In this way, a ridge structure comprising the second etching stop layer 15, the second upper cladding layer 6, and the cap layer 7 is formed.

An n type $Al_{0.7}Ga_{0.3}As$ current blocking layer 9 having a thickness of 1.9 μm is grown by MOCVD on the exposed surface of the first etching stop layer 14 and at a side surface of the ridge structure to bury the portions of the cap layer 7, the second upper cladding layer 6, and the second etching stop layer 15 left after the etching.

Figure 7:
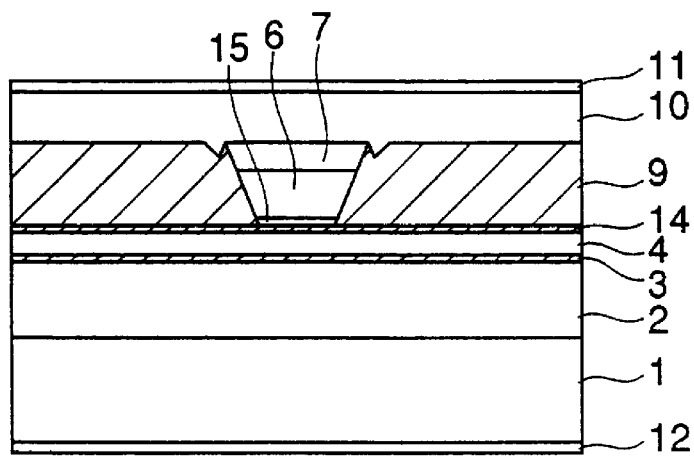
FIG. 7 is a sectional view illustrating a buried ridge semiconductor laser device in accordance with the second embodiment of the invention.
Figure 8:
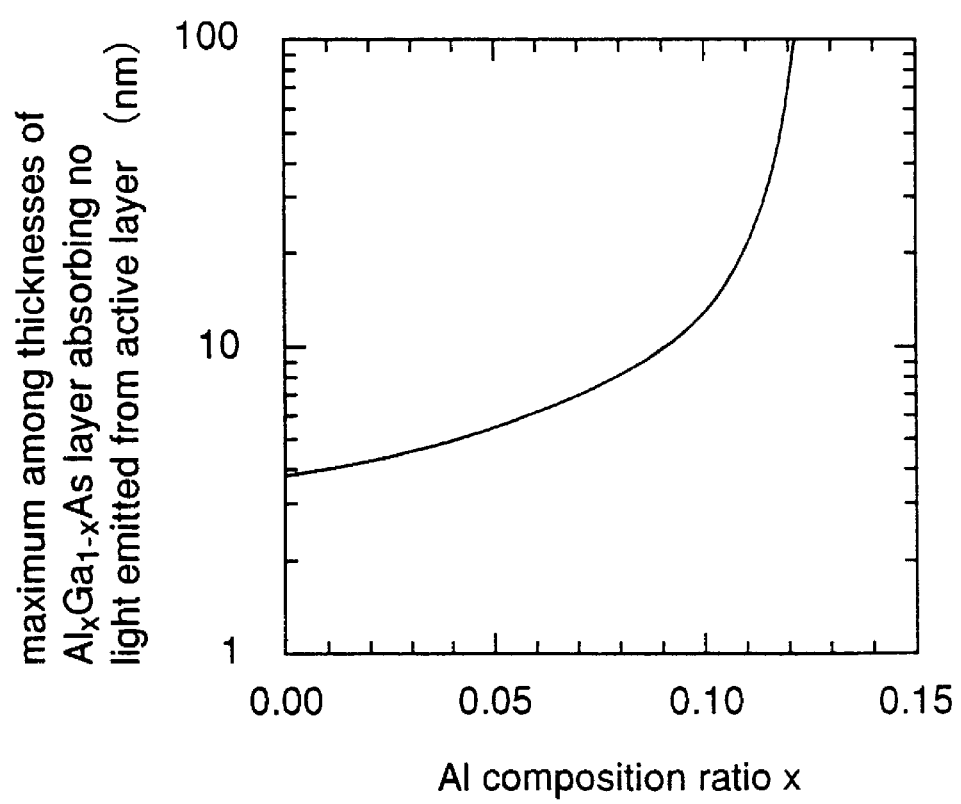
FIG. 8 is a graph showing a relation between an Al composition ratio x of an $Al_xGa_{1-x}As$ first etching stop layer and the maximum thickness of the first etching stop layer that does not absorb light emitted from an active layer, according to the second embodiment of the invention.

As shown in FIG. 6(d), after removing the SiON film 13, a p type GaAs contact layer 10 having a thickness of 2.5 μm is epitaxially grown by MOCVD over the entire surface. Finally, after the n type GaAs substrate 1 is ground to a thickness of about 100 μm, a front surface electrode 11 is formed on a surface of the contact layer 10 and a rear surface electrode 12 is formed at the rear surface of the GaAs substrate 1, followed by forming laser facets and separating chips by a method such as cleaving, resulting in a buried ridge semiconductor laser device as shown in FIG. 7.

In the second embodiment of the invention, the n type $Al_{0.7}Ga_{0.3}As$ current blocking layer 9 is grown on the surface of the p type $Al_{0.1}Ga_{0.9}As$ first etching stop layer 14 which is exposed by the etching for forming the ridge structure and at the side surface of the ridge structure. The Al composition ratio of the first etching stop layer 14 is 0.1, and the ratio is small, as compared with the etching stop layer 5 having an Al composition ratio of 0.7 in the prior art fabricating method shown in FIGS. 18(a)–18(e). Therefore, when the current blocking layer 9 is regrown on the surface of the $Al_{0.1}Ga_{0.9}As$ first etching stop layer 14 after exposure to air during the etching for forming the ridge structure, three-dimensional growth is suppressed more than in the prior art fabricating method shown in FIGS. 18(a)–18(e), whereby a current blocking layer having reduced crystalline defects, such as dislocations, is obtained. On this point, the same effects as in the prior art fabricating method shown in FIGS. 19(a)–19(e) are achieved.

While in the prior art fabricating method shown in FIGS. 19(a)–19(e) GaAs is used for the first etching stop layer, in the second embodiment of the invention $Al_{0.1}Ga_{0.9}As$ having a band gap energy larger than that of GaAs is used. Therefore, although the maximum thickness of the first etching stop layer that does not cause absorption of light emitted from the active layer is 3 nm in the prior art device, it becomes 13 nm in the second embodiment. In the second embodiment of the invention the thickness of the first etching stop layer is larger than that in the prior art device. Thus, even if a surface portion of the first etching stop layer is etched to some degree during the etching of the second etching stop layer, etching through the first etching stop layer, which is probable in using the prior art fabricating method shown in FIGS. 19(a)–19(e), is hardly caused, whereby the first etching stop layer in the whole region of both sides of the ridge structure can be preserved. Further, since the maximum thickness of the first etching stop layer is large, control of its thickness in the process of growing the etching stop layer is facilitated, as compared with the prior art device. As described above, according to the second embodiment of the invention, a semiconductor laser device, in which current leakage which is caused by crystalline defects, such as dislocations, in the current blocking layer is suppressed and no light is absorbed in the first etching stop layer, is fabricated by stable processes. That is, a semiconductor laser device having a low threshold current and a high efficiency can be fabricated with a stable yield.

In addition, while an $Al_{0.1}Ga_{0.9}As$ layer is used as the first etching stop layer, an $Al_xGa_{1-x}As$ layer having an Al composition ratio x ($0<x \leq 0.3$) may be used. In this case, however, the thickness of the first etching stop layer must not exceed the maximum thickness that does not cause the absorption of the light emitted from the active layer, which depends on its Al composition ratio x.

While the current blocking layer comprises $Al_{0.7}Ga_{0.3}As$, the layer may comprise other semiconductors, such as InGaP. While the active layer comprises $Al_{0.1}Ga_{0.9}As$ and has a single layer structure, the layer may comprise other semiconductors, such as GaAs and InGaAs, and may have a multilayer structure, such as a multiple quantum well structure.

In addition, the etchant used in the etching for forming the ridge structure need not be a mixture of tartaric acid and hydrogen peroxide but may be a mixture of another organic acid, such as citric acid, and hydrogen peroxide.

[Embodiment 3]
Structure 1

In a method of fabricating a self-aligned structure (SAS) type semiconductor laser device having a double heterostructure according to a third embodiment of the present invention, as shown in FIGS. 9(a)–9(d), a first conductivity type AlGaAs lower cladding layer 22, an AlGaAs active layer 23, a second conductivity type AlGaAs first upper cladding layer 24 opposite to the first conductivity type, a second conductivity type $Al_xGa_{1-x}As$ protecting layer 25 having an Al composition ratio x of $0<x<0.3$, smaller than that of the first upper cladding layer 24, and having a thickness at which a band gap energy is equal to or larger than that of the active layer 23 due to the quantum effect, a first conductivity type AlGaAs current blocking layer 26 having an Al composition ratio larger than that of the protecting layer 25, and a second conductivity type GaAs cap layer 27, are successively formed on a first conductivity type GaAs substrate 1. Then, a covering film 30 having a stripe-shaped opening portion is deposited on the GaAs cap layer 27 and, using the covering film 30 as a mask, the GaAs cap layer 27 and the AlGaAs current blocking layer 26 below the opening in the covering film 30 are selectively etched until a surface of the $Al_xGa_{1-x}As$ protecting layer 25 is exposed, thereby forming a stripe-shaped groove 40.

After removal of the covering film 30, a second conductivity type AlGaAs second upper cladding layer 28 having an Al composition ratio larger than that of the protecting layer 25 and a second conductivity type GaAs contact layer 29 are successively formed over the entire surface including the inner surface of the stripe-shaped groove 40. Therefore, even when the $Al_xGa_{1-x}As$ protecting layer 25 is reduced to a thickness at which its band gap energy is equal to or larger than that of the active layer 23 due to the quantum effect, the protecting layer 25 can be made thicker than the GaAs protecting layer in the prior art device. Thus, the AlGaAs protecting layer 25 can remain with good controllability even after the etching of the AlGaAs current blocking layer 26 and, further, the AlGaAs second upper cladding layer 28 having a few dislocations and good crystalline quality can be regrown with good reproducibility. Consequently, generation of defects, such as dislocations, in the AlGaAs second upper cladding layer 28 can be suppressed and deterioration of laser characteristics caused by the defects can be prevented.

Structure 2

An SAS semiconductor laser device having a double heterostructure according to the third embodiment of the present invention is fabricated as shown in FIGS. 9(a)–9(d) and 10 by successively forming a first conductivity type AlGaAs lower cladding layer 22, an AlGaAs active layer 23, a second conductivity type AlGaAs first upper cladding layer 24, opposite to the first conductivity type, a second conductivity type $Al_xGa_{1-x}As$ protecting layer 25 having an Al composition ratio x of 0<x<0.3 smaller than that of the first upper cladding layer 24 and having a thickness at which its band gap energy is equal to or larger than that of the active layer 23 due to a quantum effect, a first conductivity type AlGaAs current blocking layer 26 having an Al composition ratio larger than that of the protecting layer 25, and a second conductivity type GaAs cap layer 27 on a first conductivity type GaAs substrate 1, selectively etching the GaAs cap layer 27 and the AlGaAs current blocking layer 26 in a stripe-shaped region until a surface of the $Al_xGa_{1-x}As$ protecting layer 25 is exposed, thereby forming a stripe-shaped groove 40, and successively forming a second conductivity type AlGaAs second upper cladding layer 28 having an Al composition ratio larger than that of the protecting layer 25 and a second conductivity type GaAs contact layer 29 over the entire surface including the inner surface of the stripe-shaped groove 40. Therefore, even when the $Al_xGa_{1-x}As$ protecting layer 25 is reduced to a thickness at which its band gap energy is equal to or larger than that of the active layer 23 due to the quantum effect, the protecting layer 25 can be made thicker than the GaAs protecting layer in the prior art device, whereby the AlGaAs protecting layer 25 can remain with good controllability even after the etching of the AlGaAs current blocking layer 26 and, further, the AlGaAs second upper cladding layer 28 having few dislocations and good crystalline quality can be regrown with good reproducibility. Consequently, generation of defects, such as dislocations, in the AlGaAs second upper cladding layer 28 can be suppressed and deterioration of laser characteristics caused by the defects can be prevented.

Embodiment 3

FIGS. 9(a)–9(d) are sectional views illustrating process steps in a method of fabricating an SAS semiconductor laser device having a double heterostructure and having an oscillation wavelength in the vicinity of 0.78–0.81 μm according to the third embodiment of the present invention. In the figures, reference numeral 1 designates an n type GaAs substrate. An n type $Al_{0.55}Ga_{0.45}As$ lower cladding layer 22 having a thickness of 1.5 μm, an $Al_{0.12}Ga_{0.88}As$ active layer 23 having a thickness of 12 nm, a p type $Al_{0.55}Ga_{0.45}As$ first upper cladding layer 24 having a thickness of 0.2 μm, a p type $Al_{0.15}Ga_{0.85}As$ protecting layer 25 having a thickness of 5 nm, an n type $Al_{0.54}Ga_{0.25}As$ current blocking layer 26 having a thickness of 1.0 μm, a p type GaAs cap layer 27 having a thickness of 0.1 μm, an p type $Al_{0.55}Ga_{0.45}As$ second upper cladding layer 28 having a thickness of 1.3 μm, and a p type GaAs contact layer 29 having a thickness of 2 μm are successively disposed on the n type GaAs substrate 1. Reference numeral 30 designates a resist film, and numeral 40 designates a stripe-shaped groove.

Figure 9:
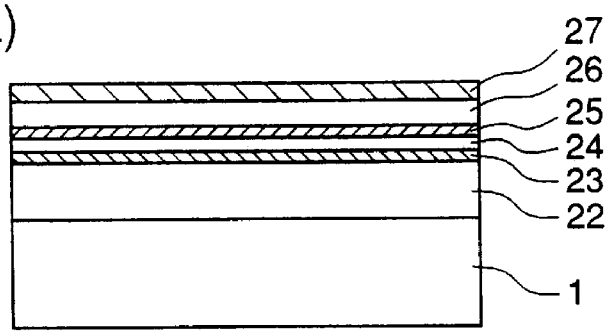
FIGS. 9(a)–9(d) are sectional views illustrating process steps in a method of fabricating an SAS semiconductor laser device in accordance with a third embodiment of the present invention.
Figure 9:
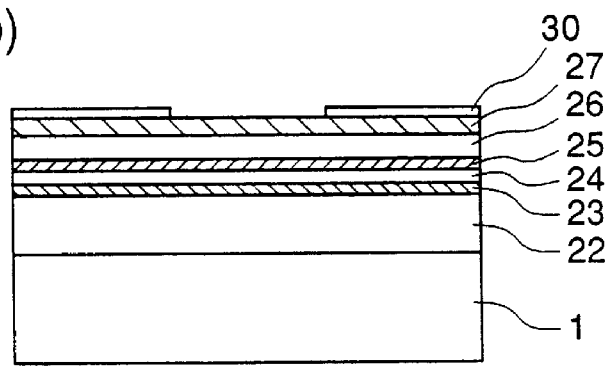
Figure 9:
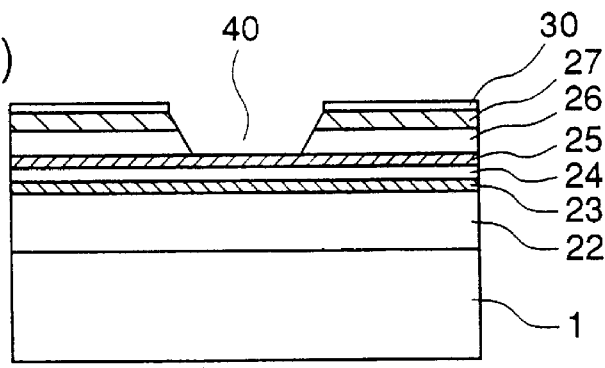
Figure 9:
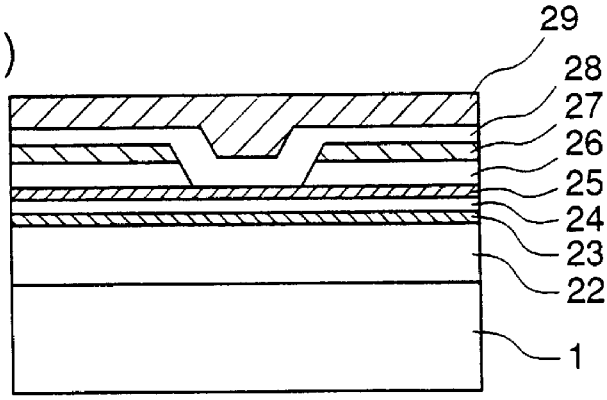
Figure 10:
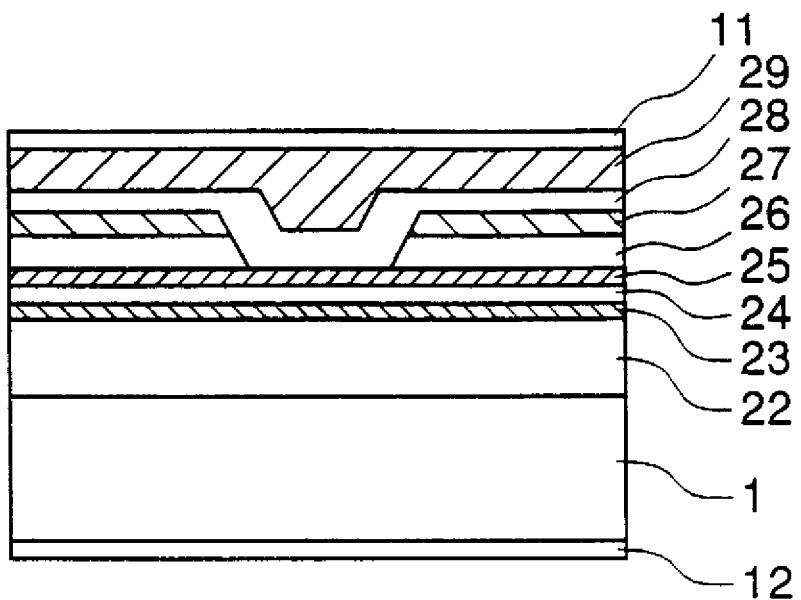
FIG. 10 is a sectional view illustrating an SAS semiconductor laser device in accordance with the third embodiment of the invention.

A description is given of a method of fabricating the SAS semiconductor laser device. Initially, as shown in FIG. 9(a), an n type $Al_{0.55}Ga_{0.45}As$ lower cladding layer 22, an $Al_{0.12}Ga_{0.88}As$ active layer 23, a p type $Al_{0.55}Ga_{0.45}As$ first upper cladding layer 24, a p type $Al_{0.15}Ga_{0.85}As$ protecting layer 25, an n type $Al_{0.75}Ga_{0.25}As$ current blocking layer 26, and a p type GaAs cap layer 27 are successively grown on an n type GaAs substrate 1 by MOCVD. In this growth, the thickness of the p type $Al_{0.15}Ga_{0.85}As$ protecting layer 25 is 5 nm so its band gap energy is equal to or larger than that of the $Al_{0.12}Ga_{0.88}As$ active layer 23 due to the above-described quantum effect.

As shown in FIG. 9(b), a resist film 30 having a stripe-shaped opening is formed on the p type GaAs cap layer 27 using a photolithographic technique. In the step of FIG. 9(c), using the resist film 30 as a mask, the p type GaAs cap layer 27 and the n type $Al_{0.75}Ga_{0.25}As$ current blocking layer 26 at the opening in the resist film 30 are selectively etched until a surface of the p type $Al_{0.15}Ga_{0.85}As$ protecting layer 25 is exposed, thereby forming a stripe-shaped groove 40. The etching of the p type GaAs cap layer 27 is performed using an etchant having an etching rate of GaAs >> the etching rate of AlGaAs, such as a mixture of $NH_4OH$ and $H_2O_2$ in the ratio 1:30, and the etching of the n type $Al_{0.75}Ga_{0.25}As$ current blocking layer 26 is performed using an etchant having an etching rate of AlGaAs >> the etching rate of GaAs, such as HCl, so that the stripe-shaped groove 40 having a depth required to expose the surface of the p type $Al_{0.15}Ga_{0.85}As$ protecting layer 25 can be formed with good controllability. Then, as shown in FIG. 9(d), after removal of the resist film 30, an p type $Al_{0.55}Ga_{0.45}As$ second upper cladding layer 28 and a p type GaAs contact layer 29 are successively grown by MOCVD over the entire surface. Finally, after the n type GaAs substrate 1 is ground to a thickness of about 100 μm, a front surface electrode 11 is formed on a surface of the contact layer 29 and a rear surface electrode 12 is formed at the rear surface of the GaAs substrate 1, followed by forming laser facets and separating chips by cleaving, resulting in the SAS semiconductor laser device shown in FIG. 10.

In the method of fabricating the semiconductor laser device according to the third embodiment of the invention, while the resist film 30 is used as an etching mask for forming the stripe-shaped groove 40, an insulating film such as an SiON film may be used therefor.

While the etching of the GaAs cap layer 27 is performed using the mixture of $NH_4OH$ and $H_2O_2$ in the ratio 1:30 as an etchant for forming the stripe-shaped groove 40, any etchant which has an etching rate of GaAs >> the etching rate of AlGaAs may be used. While the etching of the $Al_{0.75}Ga_{0.25}As$ current blocking layer 26 is performed using HCl, any etchant which has an etching rate of AlGaAs >> the etching rate of GaAs may be used. In addition, the etching for forming the stripe-shaped groove 40 may be dry etching.

Figure 11:
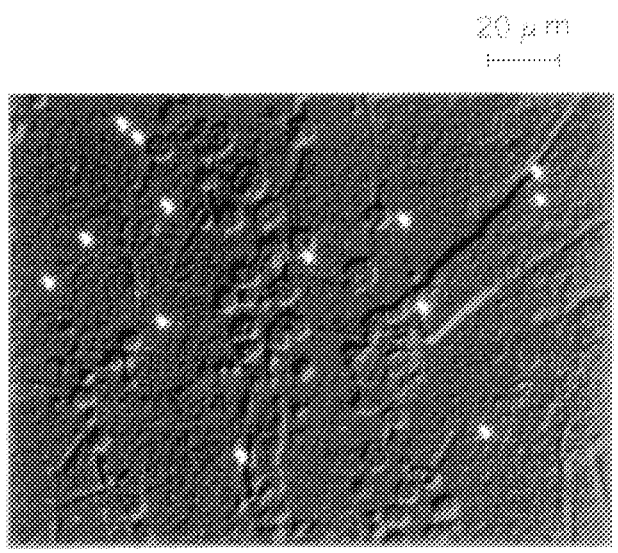
FIGS. 11(a)–11(c) are microphotographs showing etch pits after successively growing a p type $Al_{0.5}Ga_{0.5}As$ layer corresponding to a first upper cladding layer, a p type $Al_xGa_{1-x}As$ layer corresponding to a protecting layer, and an n type $Al_{0.7}Ga_{0.3}As$ layer corresponding to a current blocking layer on a GaAs substrate, regrowing a GaAs layer after removing the n type $Al_{0.7}Ga_{0.3}As$ layer using HCl, and etching of a surface of the GaAs regrown layer using molten KOH, observed with an optical microscope, of specimens in which a GaAs layer having a thickness of 2 nm, an $Al_{0.15}Ga_{0.85}As$ layer having a thickness of 5 nm, and an $Al_{0.20}Ga_{0.80}As$ layer having a thickness of 10 nm are used as the p type $Al_xGa_{1-x}As$ layer, respectively.
Figure 11:
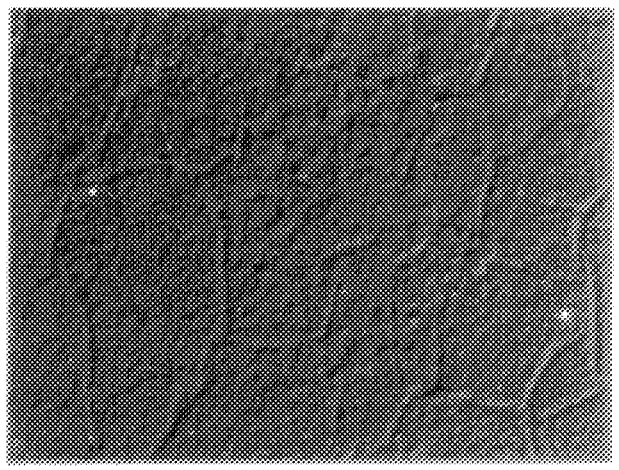
Figure 11:
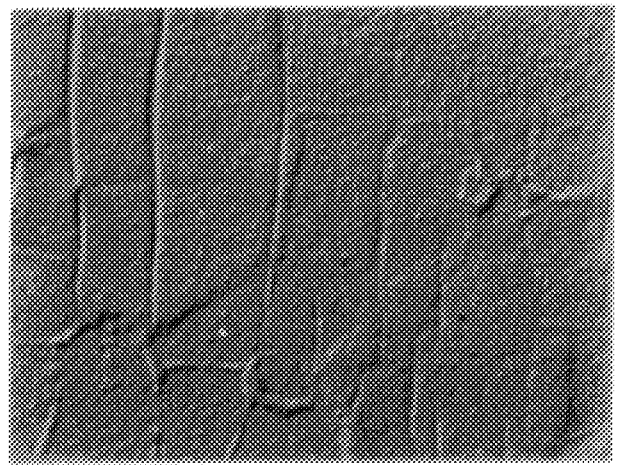

FIGS. 11(a)–11(c) show the results of observation with an optical microscope of etch pit density (EPD) after successively growing a p type $Al_{0.5}Ga_{0.5}As$ layer corresponding to the first upper cladding layer 24, a p type $Al_xGa_{1-x}As$ layer corresponding to the protecting layer 25, and an n type $Al_{0.7}Ga_{0.3}As$ layer corresponding to the current blocking layer 26 on the GaAs substrate 1, regrowing a GaAs layer after removing the n type $Al_{0.7}Ga_{0.3}As$ layer using HCl, and etching of a surface of the GaAs regrown layer using molten KOH. Three layers, namely, GaAs having a thickness of 2 nm, $Al_{0.15}Ga_{0.85}As$ having a thickness of 5 nm, and $Al_{0.20}Ga_{0.80}As$ having a thickness of 10 nm are respectively used for the p type $Al_xGa_{1-x}As$ layer. The respective thicknesses of the three layers are set so that the layers do not absorb laser light having a wavelength of 0.78 μm due to the above-described quantum effect. FIGS. 11(a)–11(c) show the results of the observation when GaAs having a thickness of 2 nm, $Al_{0.15}Ga_{0.85}As$ having a thickness of 5 nm, and $Al_{0.20}Ga_{0.80}As$ having a thickness of 10 nm are used, respectively. As is seen from these figures, the EPD of the GaAs regrown layer is below 2000/cm$^2$ when Al$_{0.15}$Ga$_{0.85}$As having a thickness of 5 nm and Al$_{0.20}$Ga$_{0.80}$As having a thickness of 10 nm are respectively used for the p type Al$_x$Ga$_{1-x}$As layer. However, when GaAs having a thickness of 2 nm is used therefor, the EPD is 4×10$^4$/cm$^2$, equal to that when the GaAs layer is regrown directly on the Al$_{0.5}$Ga$_{0.5}$As layer. As described above, if the extremely thin p type GaAs protecting layer 25 having a thickness below 3 nm is used, the GaAs protecting layer 25 may be removed at the same time that the n type Al$_{0.75}$Ga$_{0.25}$As current blocking layer 26 is etched and removed. However, if the p type Al$_{0.15}$Ga$_{0.85}$As protecting layer 25 having a thickness of about 5 nm is used, the p type Al$_{0.15}$Ga$_{0.85}$As protecting layer 25 can remain with good controllability even after the etching of the n type Al$_{0.75}$Ga$_{0.25}$As current blocking layer 26. Further, the p type Al$_{0.55}$Ga$_{0.45}$As second upper cladding layer 28 having few dislocations and good crystalline quality can be formed with good controllability.

In the third embodiment of the invention, since a p type Al$_{0.15}$Ga$_{0.85}$As layer having a thickness 5 nm larger than the GaAs protecting layer in the prior art device is used as the protecting layer 25, the p type Al$_{0.15}$Ga$_{0.85}$As protecting layer 25 can remain with good controllability even after the etching of the n type Al$_{0.75}$Ga$_{0.25}$As current blocking layer 26. Further, the p type Al$_{0.55}$Ga$_{0.45}$As second upper cladding layer 28 having few dislocations and good crystalline quality can be regrown with good reproducibility. Therefore, generation of defects, such as dislocations, in the Al$_{0.55}$Ga$_{0.45}$As second upper cladding layer 28 can be suppressed and deterioration of laser characteristics can be prevented.

While the Al composition ratio x of the Al$_x$Ga$_{1-x}$As protecting layer 25 is 0.15, it may be in the range of 0<x<0.3 and smaller than that of the upper cladding layer 24. In addition, the AlGaAs layers, except the protecting layer 25, may have Al composition ratios different from the above-described values.

While the thickness of the Al$_x$Ga$_{1-x}$As protecting layer 25 is 5 nm, it may be set to produce a band gap energy equal to or larger than that of the AlGaAs active layer 23 due to the quantum effect.

[Embodiment 4]
Structure 1

In a method of fabricating an SAS semiconductor laser device having a double heterostructure according to a fourth embodiment of the present invention, as shown in FIGS. 12(a)–12(d), a first conductivity type AlGaAs lower cladding layer 22, an AlGaAs active layer 23, a second conductivity type AlGaAs first upper cladding layer 24, a second conductivity type Al$_x$Ga$_{1-x}$As protecting layer 25 having an Al composition ratio x of 0<x<0.3, smaller than that of the first upper cladding layer 24 and having a thickness at which its band gap energy is equal to or larger than that of the active layer 23 due to the quantum effect, a second conductivity type AlGaAs etching stop layer 32 having an Al composition ratio larger than that of the protecting layer 25, a first conductivity type GaAs current blocking layer 33, and a second conductivity type GaAs cap layer 27 are successively formed on a first conductivity type GaAs substrate 1.

A covering film 30 having a stripe-shaped opening is deposited on the GaAs cap layer 27 and, using the covering film 30 as a mask, the GaAs cap layer 27 and the GaAs current blocking layer 33 in the opening in the covering film 30 are selectively etched until a surface of the AlGaAs etching stop layer 32 is exposed. Further, the AlGaAs etching stop layer 32 is selectively etched until a surface of the Al$_x$Ga$_{1-x}$As protecting layer 25 is exposed, thereby forming a stripe-shaped groove 40. After removal of the covering film 30, a second conductivity type AlGaAs second upper cladding layer 28 having an Al composition ratio larger than that of the protecting layer 25 and a second conductivity type GaAs contact layer 29 are successively formed over the entire surface including the inner surface of the stripe-shaped groove 40.

As described above, since the current blocking layer 33 is an n type GaAs layer and the GaAs current blocking layer 33 is formed on the AlGaAs etching stop layer 32, the GaAs current blocking layer 33 can be selectively removed by an etchant having a sufficiently large selectivity ratio with respect to the AlGaAs etching stop layer 32, whereby reproducibility and stability of the etching can be improved. In addition, the protecting layer 25 is thicker than the GaAs protecting layer in the prior art device as in the third embodiment of the invention and the AlGaAs etching stop layer 32 is much thinner than the current blocking layer 33. Therefore, when the etching stop layer 32 is etched selectively with respect to the p type AlGaAs protecting layer 25 having an Al composition ratio smaller than that of the etching stop layer 32, the etching time is shortened and there is a further reduced possibility that the protecting layer 25 might be etched simultaneously with the etching of the etching stop layer 32, as compared with the third embodiment of the invention. Accordingly, the AlGaAs protecting layer 25 can remain with good controllability even after the etching of the etching stop layer 32. Further, the AlGaAs second upper cladding layer 28 has few dislocations and good crystalline quality and can be regrown with good reproducibility. Consequently, generation of defects, such as dislocations, in the AlGaAs second upper cladding layer 28 can be suppressed and deterioration of laser characteristics caused by the defects can be better prevented than in the third embodiment.

Structure 2

An SAS semiconductor laser device having a double heterostructure according to the fourth embodiment of the present invention is fabricated as shown in FIGS. 12(a)–12(d) and 13 by successively forming a first conductivity type AlGaAs lower cladding layer 22, an AlGaAs active layer 23, a second conductivity type AlGaAs first upper cladding layer 24, a second conductivity type Al$_x$Ga$_{1-x}$As protecting layer 25 having an Al composition ratio x of 0<x<0.3, smaller than that of the first upper cladding layer 24, and having a thickness at which its band gap energy is equal to or larger than that of the active layer 23 due to a quantum effect, a second conductivity type AlGaAs etching stop layer 32 having an Al composition ratio larger than that of the protecting layer 25, a first conductivity type GaAs current blocking layer 33, and a second conductivity type GaAs cap layer 27 on a first conductivity type GaAs substrate 1. The growth steps are followed by selectively etching the GaAs cap layer 27 and the GaAs current blocking layer 33 in a stripe-shaped region until a surface of the AlGaAs etching stop layer 32 is exposed and, further, selectively etching the AlGaAs etching stop layer 32 until a surface of the Al$_x$Ga$_{1-x}$As protecting layer 25 is exposed, thereby forming a stripe-shaped groove 40. A second conductivity type AlGaAs second upper cladding layer 28 having an Al composition ratio larger than that of the protecting layer 25 and a second conductivity type GaAs contact layer 29 are successively formed over the entire surface, including the inner surface, of the stripe-shaped groove 40. As described above, since the current blocking layer 33 is an n type GaAs layer and the GaAs current blocking layer 33 is formed on the AlGaAs etching stop layer 32, the GaAs current blocking layer 33 can be selectively removed by an etchant having a sufficiently large selectivity ratio with respect to the AlGaAs etching stop layer 32, whereby reproducibility and stability of the etching can be improved. In addition, the protecting layer 25 is made thicker than the GaAs protecting layer in the prior art device, as in the third embodiment of the invention, and the AlGaAs etching stop layer 32 is made much thinner than the current blocking layer 33. Therefore, when the etching stop layer 32 is etched selectively with respect to the p type AlGaAs protecting layer 25 having an Al composition ratio smaller than that of the etching stop layer 32, the etching time is shortened and there is a further reduced possibility that the protecting layer 25 will be etched simultaneously with the etching of the etching stop layer 32, as compared with the third embodiment of the invention. Accordingly, the AlGaAs protecting layer 25 can remain, with good controllability, even after the etching of the etching stop layer 32, and, further, the AlGaAs second upper cladding layer 28 having few dislocations and good crystalline quality can be regrown with good reproducibility. Consequently, generation of defects, such as dislocations, in the AlGaAs second upper cladding layer 28 can be suppressed better and deterioration of laser characteristics caused by the defects can be better prevented than in the third embodiment.

Embodiment 4

FIGS. 12(a)–12(d) are sectional views illustrating process steps in a method of fabricating an SAS semiconductor laser device having a double heterostructure and having an oscillation wavelength in the vicinity of 0.78–0.81 μm according to the fourth embodiment of the present invention. In the figures, reference numeral 1 designates an n type GaAs substrate. An n type $Al_{0.55}Ga_{0.45}As$ lower cladding layer 22 having a thickness of 1.5 μm, an $Al_{0.12}Ga_{0.88}As$ active layer 23 having a thickness of 12 nm, a p type $Al_{0.55}Ga_{0.45}As$ first upper cladding layer 24 having a thickness of 0.2 μm, a p type $Al_{0.15}Ga_{0.85}As$ protecting layer 25 having a thickness of 5 nm, a p type $Al_{0.7}Ga_{0.3}As$ etching stop layer 32 having a thickness of 5 nm, an n type GaAs current blocking layer 33 having a thickness of 1.0 μm, a p type GaAs cap layer 27 having a thickness of 0.1 μm, a p type $Al_{0.55}Ga_{0.45}As$ second upper cladding layer 28 having a thickness of 1.3 μm, and a p type GaAs contact layer 29 having a thickness of 2 μm are successively disposed on the n type GaAs substrate 1. Reference numeral 30 designates a resist film.

Figure 12:
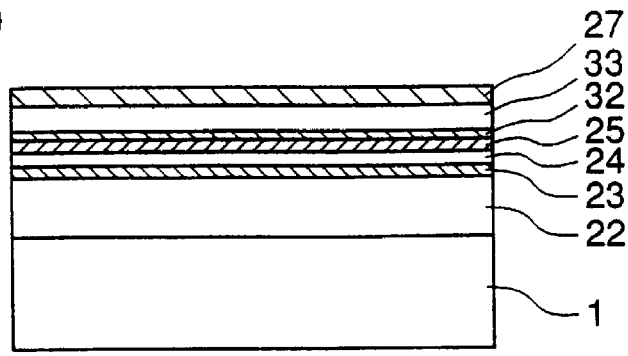
FIGS. 12(a)–12(d) are sectional views illustrating process steps in a method of fabricating an SAS semiconductor laser device in accordance with a fourth embodiment of the present invention.
Figure 12:
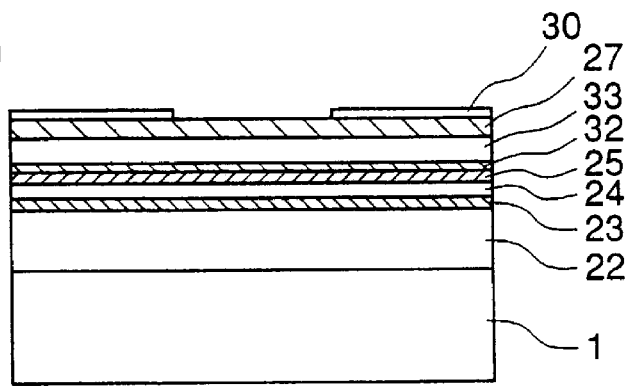
Figure 12:
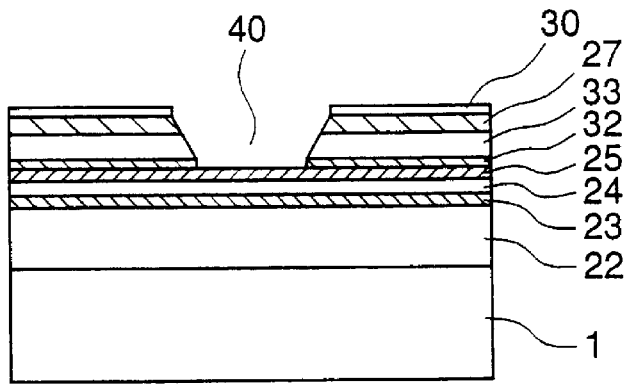
Figure 12:
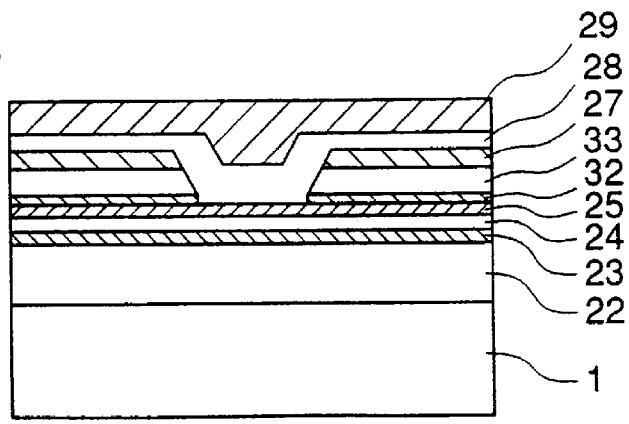
Figure 13:
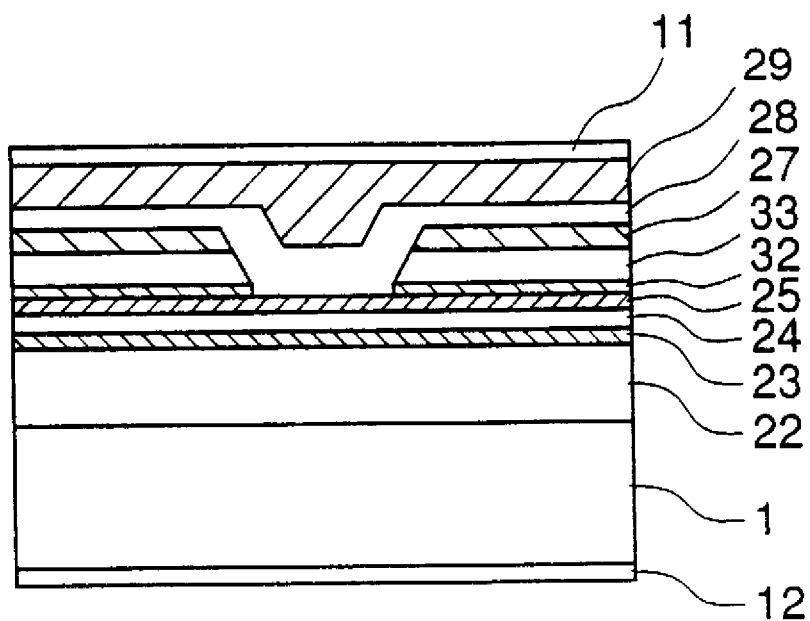
FIG. 13 is a sectional view illustrating an SAS semiconductor laser device in accordance with the fourth embodiment of the invention.

A description is given of the method of fabricating the SAS semiconductor laser device. Initially, as shown in FIG. 12(a), an n type $Al_{0.55}Ga_{0.45}As$ lower cladding layer 22, an $Al_{0.12}Ga_{0.88}As$ active layer 23, a p type $Al_{0.55}Ga_{0.45}As$ first upper cladding layer 24, a p type $Al_{0.15}Ga_{0.85}As$ protecting layer 25, a p type $Al_{0.7}Ga_{0.3}As$ etching stop layer 32, an n type GaAs current blocking layer 33, and a p type GaAs cap layer 27 are successively grown on an n type GaAs substrate 1 by MOCVD. The thickness of the p type $Al_{0.15}Ga_{0.85}As$ protecting layer 25 is set to 5 nm to have a band gap energy equal to or larger than the $Al_{0.12}Ga_{0.88}As$ active layer 23 due to a quantum effect. Next, as shown in FIG. 12(b), a resist film 30 having a stripe-shaped opening is formed on the p type GaAs cap layer 27 using photolithographic techniques. In the step of FIG. 12(c), using the resist film 30 as a mask, the p type GaAs cap layer 27, the n type GaAs current blocking layer 33, and the p type $Al_{0.7}Ga_{0.3}As$ etching stop layer 32 are selectively etched until a surface of the p type $Al_{0.15}Ga_{0.85}As$ protecting layer 25 is exposed, thereby forming a stripe-shaped groove 40. At this time, the p type GaAs cap layer 27 and the n type GaAs current blocking layer 33 are etched using an etchant having an etching rate of GaAs >> the etching rate of AlGaAs, such as a mixture of $NH_4OH$ and $H_2O_2$ in the ratio 1:30. The p type $Al_{0.7}Ga_{0.3}As$ etching stop layer 32 is etched using an etchant having an etching rate of AlGaAs >> the etching rate of GaAs, such as HCl, so that the stripe-shaped groove 40 having a depth required to expose the surface of the p type $Al_{0.15}Ga_{0.85}As$ protecting layer 25 can be formed with good controllability. Then, as shown in FIG. 12(d), after removal of the resist film 30, a p type $Al_{0.55}Ga_{0.45}As$ second upper cladding layer 28 and a p type GaAs contact layer 29 are successively grown by MOCVD over the entire surface. Finally, after the n type GaAs substrate 1 is ground to a thickness of about 100 μm, a front surface electrode 11 is formed on a surface of the contact layer 29 and a rear surface electrode 12 is formed at the rear surface of the GaAs substrate 1, followed by forming laser facets and separating chips by a method such as cleaving, resulting in an SAS semiconductor laser device as shown in FIG. 13.

In the method of fabricating the semiconductor laser device according to the fourth embodiment of the invention, while the resist film 30 is used as an etching mask for forming the stripe-shaped groove 40, an insulating film, such as an SiON film, may be used therefor.

While the GaAs cap layer 27 and the GaAs current blocking layer 33 are etched using a mixture of $NH_4OH$ and $H_2O_2$ in the ratio 1:30 for forming the stripe-shaped groove 40, any etchant that has an etching rate of GaAs >> the etching rate of AlGaAs may be used. While the etching of the $Al_{0.7}Ga_{0.3}As$ etching stop layer 32 is performed using HCl, any etchant that has an etching rate of AlGaAs >> GaAs may be used. In addition, the etching for forming the stripe-shaped groove 40 need not be wet etching but may be dry etching.

In the fourth embodiment of the invention, since the current blocking layer 33 is an n type GaAs layer and the GaAs current blocking layer 33 is formed on the $Al_{0.7}Ga_{0.3}As$ etching stop layer 32, the GaAs current blocking layer 33 can be selectively removed with an etchant having a sufficiently large selectivity ratio with respect to the $Al_{0.7}Ga_{0.3}As$ etching stop layer 32 having a large Al composition ratio, whereby reproducibility and stability of the etching process can be improved. The p type $Al_{0.15}Ga_{0.85}As$ layer having a thickness of 5 nm, larger than the 3 nm thickness of the GaAs protecting layer in the prior art device, is used as the protecting layer 25. The $Al_{0.7}Ga_{0.3}As$ etching stop layer 32 has a thickness of 5 nm, much smaller than the 1.0 μm thickness of the current blocking layer 33. Therefore, when the etching stop layer 32 is etched selectively with respect to the p type $Al_{0.15}Ga_{0.85}As$ protecting layer 25, the etching time is shortened and there is a further reduced possibility that the protecting layer 25 may be etched simultaneously with the etching of the etching stop layer 32, as compared with the third embodiment of the invention. Accordingly, the p type $Al_{0.15}Ga_{0.85}As$ protecting layer 25 can be left with good controllability, even after the etching of the etching stop layer 32, and, further, the p type $Al_{0.55}Ga_{0.45}As$ second upper cladding layer 28 having few dislocations and good crystalline quality can be regrown with good reproducibility. Consequently, generation of defects, such as dislocations, in the $Al_{0.55}Ga_{0.45}As$ second upper cladding layer 28 can be suppressed better and deterioration of laser characteristics caused by the defects can be prevented better than in the third embodiment.

While the Al composition ratio x of the $Al_xGa_{1-x}As$ protecting layer 25 is 0.15, it may be in the range of 0<x<0.3, smaller than that of the upper cladding layer 24. In addition, the AlGaAs layers, except the protecting layer 25, may have Al composition ratios different from the described values. While the thickness of the $Al_xGa_{1-x}As$ protecting layer 25 is 5 nm, it may be set to produce a band gap energy equal to or larger than that of the AlGaAs active layer 23 due to the quantum effect.

[Embodiment 5]

Structure 1

In a method of fabricating a semiconductor laser device according to a fifth embodiment of the present invention, which includes the fabricating method of the first structure of the third embodiment of the invention, as shown in FIGS. 14(a)–14(d), after the formation of the stripe-shaped groove 40, a second conductivity type AlGaAs buffer layer 34 having an Al composition ratio smaller than that of the AlGaAs second upper cladding layer 28 is formed over the entire surface. Later, the AlGaAs second upper cladding layer 28 and the GaAs contact layer 29 are successively formed. The AlGaAs second upper cladding layer 28 having a composition ratio of Al with a migration length larger than that of the protecting layer 25 is not regrown directly on the AlGaAs protecting layer 25 but is grown on the AlGaAs buffer layer 34 having an Al composition ratio smaller than that of the second upper cladding layer 28 after the buffer layer 34 is regrown on the protecting layer 25. Therefore, generation of dislocations in the buffer layer 34 is suppressed better than in the second upper cladding layer 28 when the second upper cladding layer 28 is regrown directly on the protecting layer 25. Therefore, generation of defects, such as dislocations, in the AlGaAs second upper cladding layer 28 and the GaAs contact layer 29, which are grown above the buffer layer 34, can be suppressed and deterioration of laser characteristics caused by the defects can be prevented more effectively than in the third embodiment.

Structure 2

A semiconductor laser device according to the fifth embodiment of the present invention, including the semiconductor laser device shown in the second structure of the third embodiment of the invention, is fabricated as shown in FIGS. 14(a)–14(d) and 15 by, after the formation of the stripe-shaped groove 40, forming a second conductivity type AlGaAs buffer layer 34, having an Al composition ratio smaller than that of the AlGaAs second upper cladding layer 28, over the entire surface before the AlGaAs second upper cladding layer 28 is formed. As described above, the AlGaAs second upper cladding layer 28 having a composition ratio of Al having a migration length larger than that of the protecting layer 25 is not regrown directly on the AlGaAs protecting layer 25. The layer 28 is grown on the AlGaAs buffer layer 34 having an Al composition ratio smaller than that of the second upper cladding layer 28, after the buffer layer 34 is regrown on the protecting layer 25, so that generation of dislocations in the buffer layer 34 is suppressed better than in the second upper cladding layer 28 when the second upper cladding layer 28 is regrown directly on the protecting layer 25. Therefore, generation of defects, such as dislocations, in the AlGaAs second upper cladding layer 28 and the GaAs contact layer 29, which are grown above the buffer layer 34, can be suppressed and deterioration of laser characteristics caused by the defects can be prevented more effectively than in the third embodiment.

Embodiment 5

FIGS. 14(a)–14(d) are sectional views illustrating process steps in a method of fabricating an SAS semiconductor laser device having a double heterostructure and having an oscillation wavelength in the vicinity of 0.78–0.81 $\mu$m according to the fifth embodiment of the present invention. In the figures, reference numeral 1 designates an n type GaAs substrate. An n type $Al_{0.55}Ga_{0.45}As$ lower cladding layer 22 having a thickness of 1.5 $\mu$m, an $Al_{0.12}Ga_{0.88}As$ active layer 23 having a thickness of 12 nm, a p type $Al_{0.55}Ga_{0.45}As$ first upper cladding layer 24 having a thickness of 0.2 $\mu$m, a p type $Al_{0.15}Ga_{0.85}As$ protecting layer 25 having a thickness of 5 nm, an n type $Al_{0.75}Ga_{0.25}As$ current blocking layer 26 having a thickness of 1.0 $\mu$m, a p type GaAs cap layer 27 having a thickness of 0.1 $\mu$m, a p type $Al_{0.25}Ga_{0.75}As$ buffer layer 34 having a thickness of 5 nm, a p type $Al_{0.55}Ga_{0.45}As$ second upper cladding layer 28 having a thickness of 1.3 $\mu$m, and a p type GaAs contact layer 29 having a thickness of 2 $\mu$m are successively disposed on the n type GaAs substrate 1. A resist film 30 is deposited on the cap layer 27.

Figure 14:
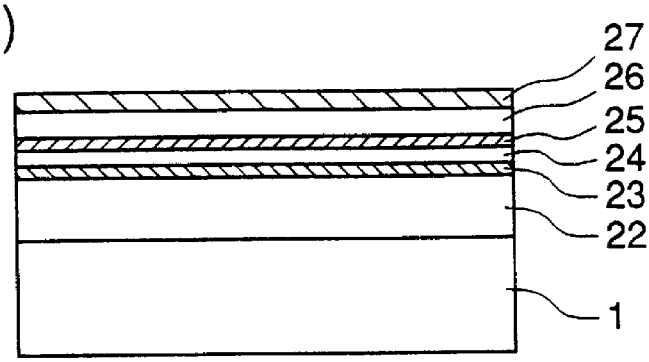
FIGS. 14(a)–14(d) are sectional views illustrating process steps in a method of fabricating an SAS semiconductor laser device in accordance with a fifth embodiment of the present invention.
Figure 14:
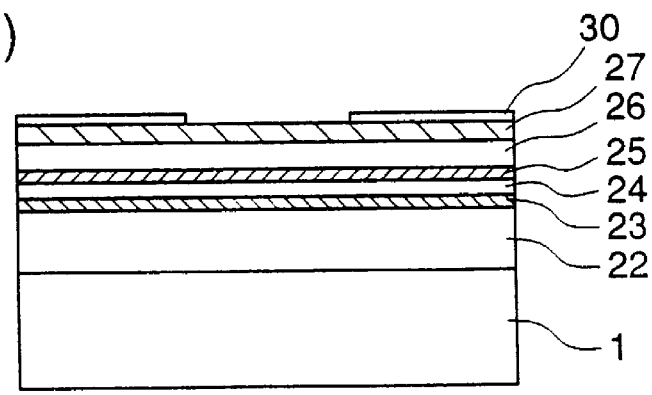
Figure 14:
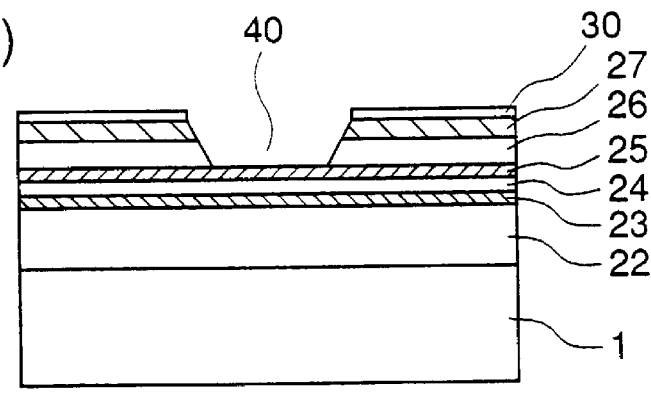
Figure 14:
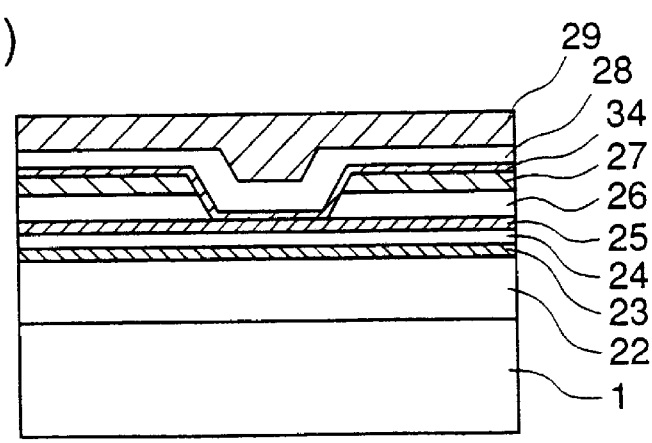
Figure 15:
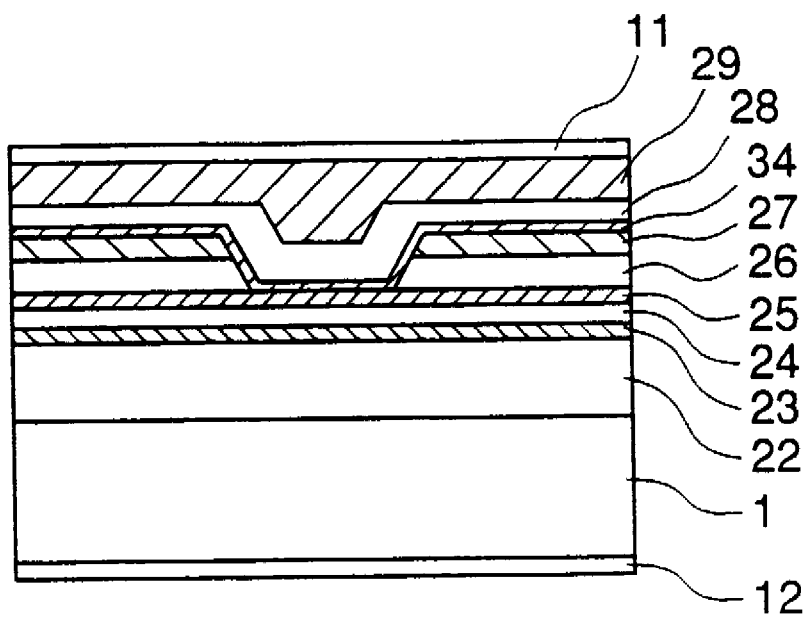
FIG. 15 is a sectional view illustrating an SAS semiconductor laser device in accordance with the fifth embodiment of the invention.

A description is given of the method of fabricating the SAS semiconductor laser device. In FIGS. 14(a)–14(c), the same process steps as those shown in FIGS. 9(a)–9(c) of the third embodiment are illustrated, and the stripe-shaped groove 40 is formed by etching until the p type $Al_{0.15}Ga_{0.85}As$ protecting layer 25 is exposed. In the step of FIG. 14(d), after removal of the resist film 30, a p type $Al_{0.25}Ga_{0.75}As$ buffer layer 34, a p type $Al_{0.55}Ga_{0.45}As$ second upper cladding layer 28, and a p type GaAs contact layer 29 are successively grown by MOCVD over the entire surface. In this growth, each thickness of the p type $Al_{0.15}Ga_{0.85}As$ protecting layer 25 and the p type $Al_{0.25}Ga_{0.75}As$ buffer layer 34 is set to produce a band gap energy equal to or larger than that of the $Al_{0.12}Ga_{0.88}As$ active layer 23 due to a quantum effect. Finally, after the n type GaAs substrate 1 is ground to a thickness of about 100 $\mu$m, a front surface electrode 11 is formed on a surface of the contact layer 29 and a rear surface electrode 12 is formed at the rear surface of the GaAs substrate 1, followed by forming laser facets and separating chips by a method such as cleaving, resulting in an SAS semiconductor laser device as shown in FIG. 15.

In the fifth embodiment of the invention, since the p type $Al_{0.55}Ga_{0.45}As$ second upper cladding layer 28 having a large composition ratio of Al and having a short migration length is not regrown directly on the p type $Al_{0.15}Ga_{0.85}As$ protecting layer 25 but is grown on the p type $Al_{0.25}Ga_{0.75}As$ buffer layer 34 having a small Al composition ratio after the buffer layer 34 is regrown on the protecting layer 25, generation of dislocations in the buffer layer 34 is suppressed better than when the second upper cladding layer 28 is regrown directly on the protecting layer 25. Therefore, generation of defects, such as dislocations, in the p type $Al_{0.55}Ga_{0.45}As$ second upper cladding layer 28 and the p type GaAs contact layer 29, which are grown above the buffer layer 34, can be suppressed, and deterioration of laser characteristics caused by the defects can be prevented more effectively than in the third embodiment.

While the Al composition ratio x of the $Al_xGa_{1-x}As$ protecting layer 25 is 0.15, it may be in the range of 0<x<0.3 and smaller than that of the upper cladding layer 24. While an Al composition ratio of the AlGaAs buffer layer 34 is 0.25, it may be smaller than that of the AlGaAs second upper cladding layer 28. In addition, the AlGaAs layers, except the protecting layer 25 and the buffer layer 34, may have Al composition ratios different from the values described. While the thickness of the $Al_xGa_{1-x}As$ protecting layer 25 is 5 nm, it may be set to produce a band gap energy equal to or larger than that of the AlGaAs active layer 23 due to the quantum effect. While the thickness of the AlGaAs buffer layer 34 is 5 nm, it may be set to produce a band gap energy equal to or larger than that of the AlGaAs active layer 23 due to the quantum effect.

[Embodiment 6]
Structure 1

In a method of fabricating a semiconductor laser device according to a sixth embodiment of the present invention, which includes the fabricating method shown in the first structure of the fourth embodiment of the invention, as shown in FIGS. 16(a)–16(d), after the formation of the stripe-shaped groove 40, a second conductivity type AlGaAs buffer layer 34 having an Al composition ratio smaller than that of the AlGaAs second upper cladding layer 28 is formed over the entire surface before the AlGaAs second upper cladding layer 28 and the GaAs contact layer 29 are successively formed. Therefore, as in the fourth embodiment of the invention, by employing the AlGaAs etching stop layer 32, the AlGaAs protecting layer 25 can remain with good reproducibility after the etching for forming the stripe-shaped groove 40. Further, since the AlGaAs buffer layer 34 having an Al composition ratio smaller than that of the second upper cladding layer 28 is regrown on the AlGaAs protecting layer 25, and the second upper cladding layer 28 is grown on the buffer layer 34, generation of dislocations in the buffer layer 34 is suppressed better when the second upper cladding layer 28 is regrown directly on the protecting layer 25. Therefore, generation of defects, such as dislocations, in the p type AlGaAs second upper cladding layer 28 and the p type GaAs contact layer 29, which are grown above the buffer layer 34, can be suppressed and deterioration of laser characteristics caused by the defects can be prevented more effectively than in the fourth embodiment.

Structure 2

A semiconductor laser device according to the sixth embodiment of the present invention, including the semiconductor laser device shown in the second structure of the fourth embodiment of the invention, is fabricated as shown in FIGS. 16(a)–16(d) and 17 by, after the formation of the stripe-shaped groove 40, forming a second conductivity type AlGaAs buffer layer 34 having an Al composition ratio smaller than that of the AlGaAs second upper cladding layer 28 over the entire surface before the AlGaAs second upper cladding layer 28 is formed. Therefore, as in the fourth embodiment of the invention, by employing the AlGaAs etching stop layer 32, the AlGaAs protecting layer 25 can remain with good reproducibility after the etching for forming the stripe-shaped groove 40. Further, since the AlGaAs buffer layer 34 having an Al composition ratio smaller than that of the second upper cladding layer 28 is regrown on the AlGaAs protecting layer 25 and the second upper cladding layer 28 is grown on the buffer layer 34, generation of dislocations in the buffer layer 34 is suppressed better than when the second upper cladding layer 28 is regrown directly on the protecting layer 25. Therefore, generation of defects, such as dislocations, in the p type AlGaAs second upper cladding layer 28 and the p type GaAs contact layer 29, which are grown above the buffer layer 34, can be suppressed and deterioration of laser characteristics caused by the defects can be prevented more effectively than in the fourth embodiment.

Embodiment 6

FIGS. 16(a)–16(d) are sectional views illustrating process steps in a method of fabricating an SAS semiconductor laser device having a double heterostructure and having an oscillation wavelength in the vicinity of 0.78–0.81 $\mu$m according to the sixth embodiment of the present invention. In the figures, reference numeral 1 designates an n type GaAs substrate. An n type $Al_{0.55}Ga_{0.45}As$ lower cladding layer 22 having a thickness of 1.5 $\mu$m, an $Al_{0.12}Ga_{0.88}As$ active layer 23 having a thickness of 12 nm, a p type $Al_{0.55}Ga_{0.45}As$ first upper cladding layer 24 having a thickness of 0.2 $\mu$m, a p type $Al_{0.17}Ga_{0.85}As$ protecting layer 25 having a thickness of 5 nm, a p type $Al_{0.7}Ga_{0.3}As$ etching stop layer 32 having a thickness of 5 nm, an n type GaAs current blocking layer 33 having a thickness of 1.0 $\mu$m, a p type GaAs cap layer 27 having a thickness of 0.1 $\mu$m, a p type $Al_{0.25}Ga_{0.75}As$ buffer layer 34 having a thickness of 5 nm, a p type $Al_{0.55}Ga_{0.45}As$ second upper cladding layer 28 having a thickness of 1.3 $\mu$m, and a p type GaAs contact layer 29 having a thickness of 2 $\mu$m are successively disposed on the n type GaAs substrate 1. Reference numeral 30 designates a resist film.

Figure 16:
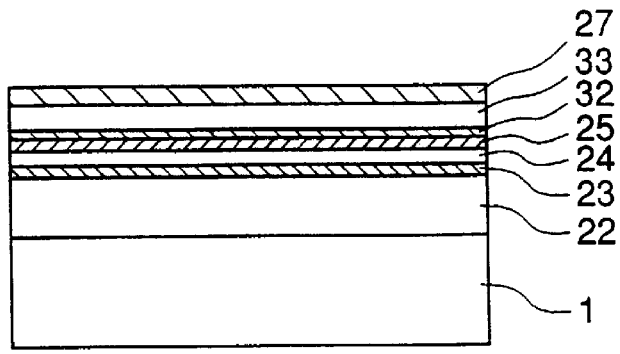
FIGS. 16(a)–16(d) are sectional views illustrating process steps in a method of fabricating an SAS semiconductor laser device in accordance with a sixth embodiment of the present invention.
Figure 16:
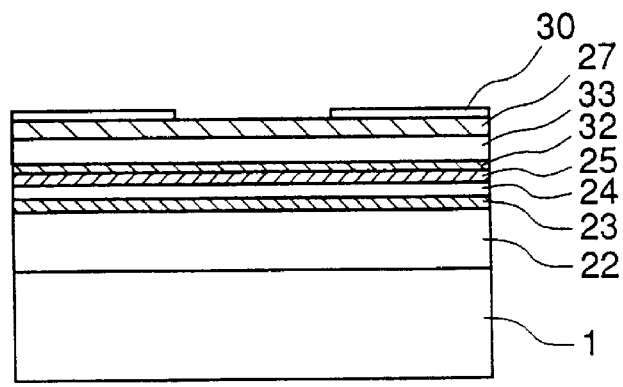
Figure 16:
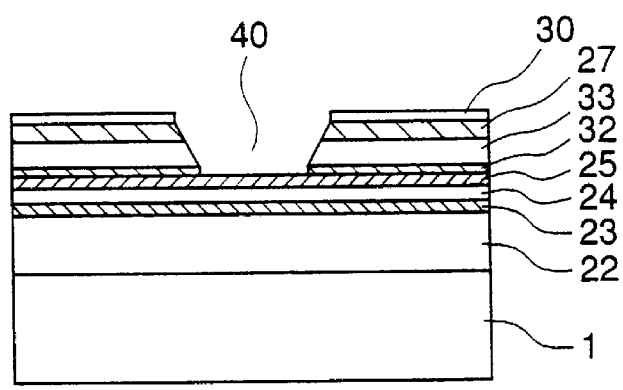
Figure 16:
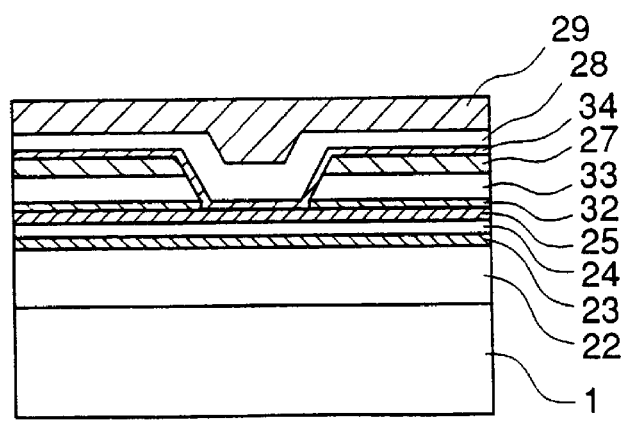
Figure 17:
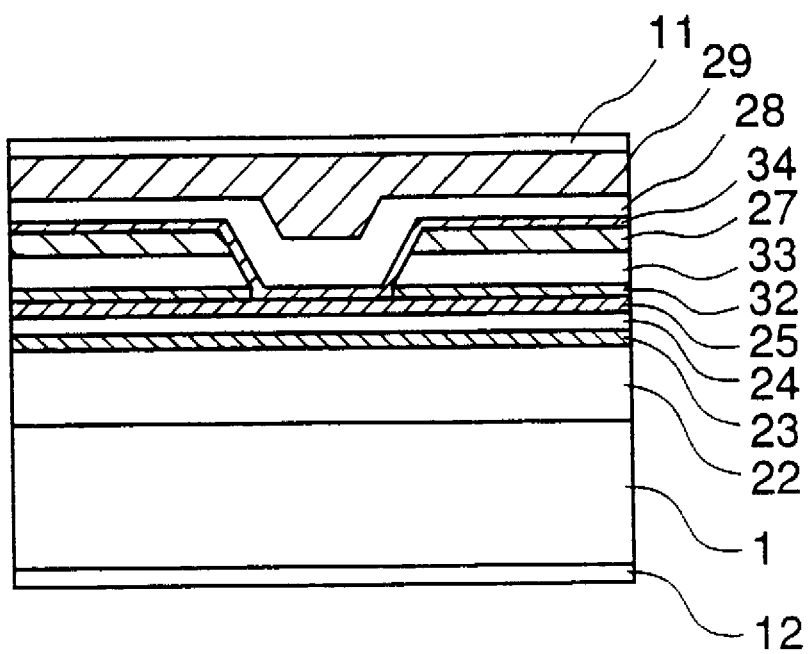
FIG. 17 is a sectional view illustrating an SAS semiconductor laser device in accordance with the sixth embodiment of the invention.
Figure 18:
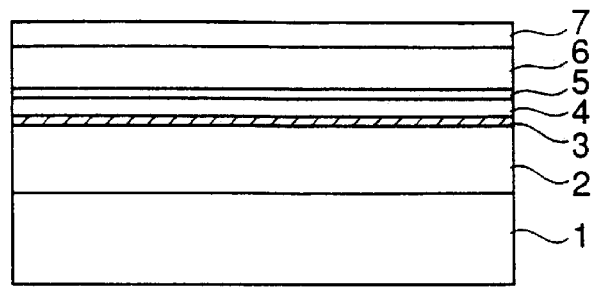
FIGS. 18(a)–18(e) are sectional views illustrating process steps in a prior art method of fabricating a buried ridge semiconductor laser device.
Figure 18:
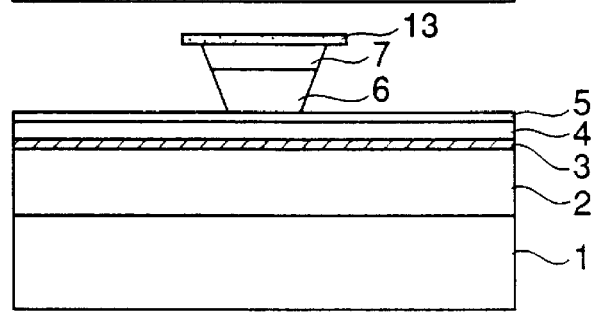
Figure 18:
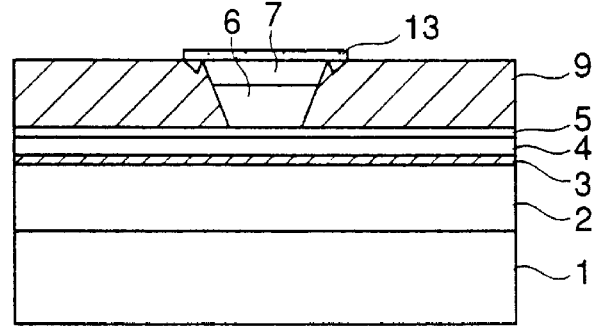
Figure 18:
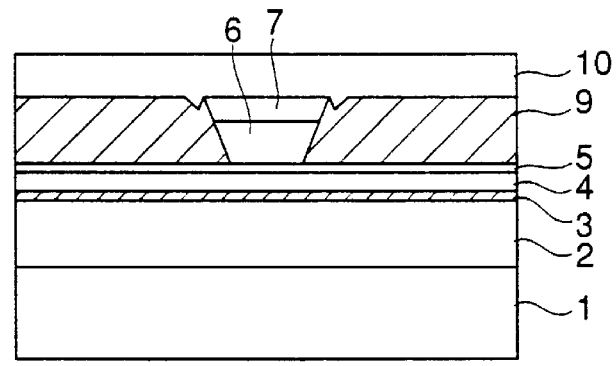
Figure 18:
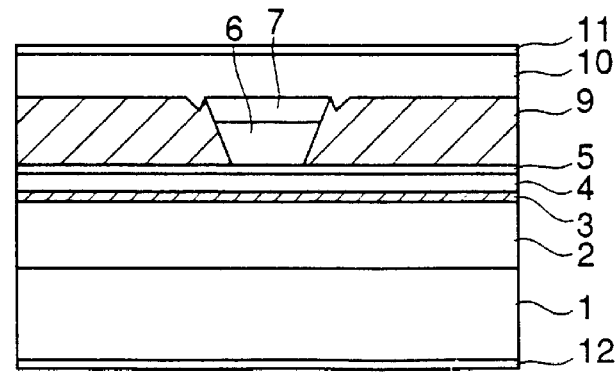
Figure 19:
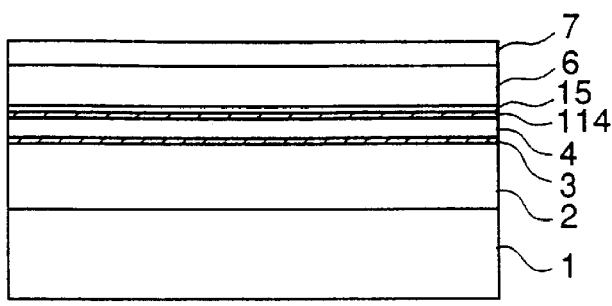
FIGS. 19(a)–19(e) are sectional views illustrating process steps in a prior art method of fabricating a buried ridge semiconductor laser device having a GaAs first etching stop layer.
Figure 19:
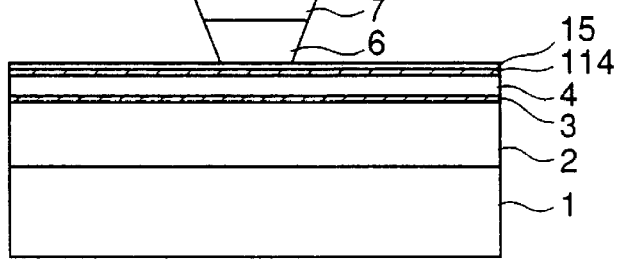
Figure 19:
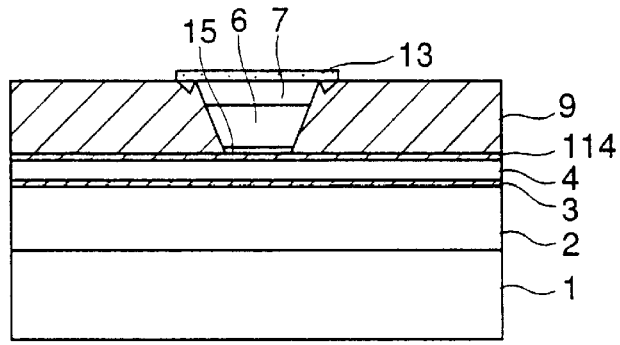
Figure 19:
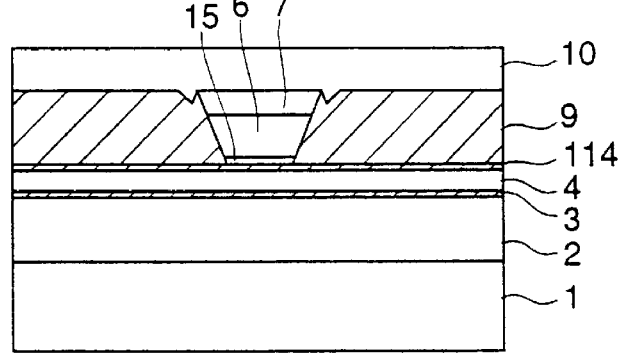
Figure 19:
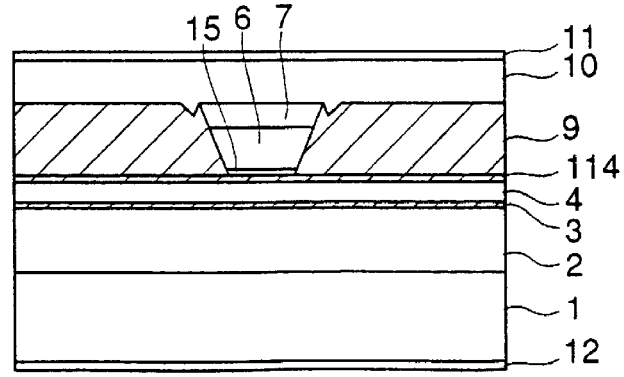
Figure 20:
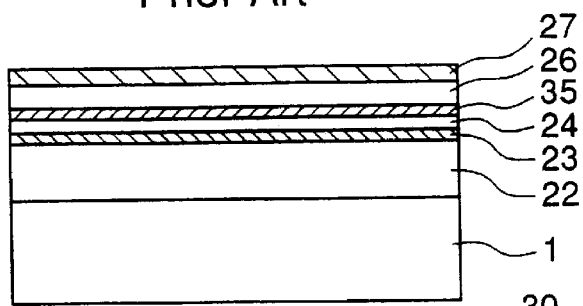
FIGS. 20(a)–20(e) are sectional views illustrating process steps in a prior art method of fabricating an SAS semiconductor laser device.
Figure 20:
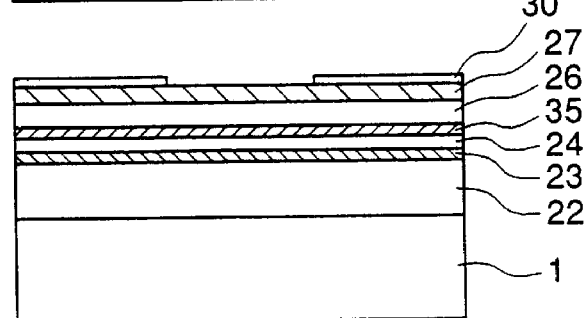
Figure 20:
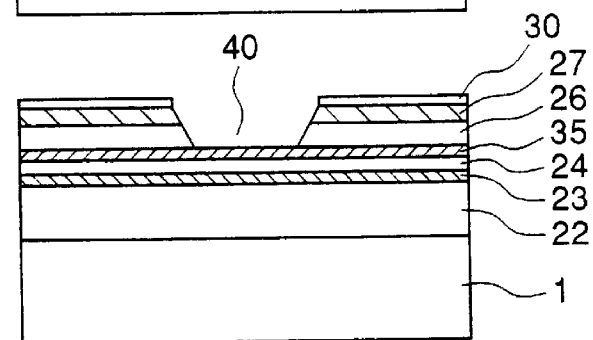
Figure 20:
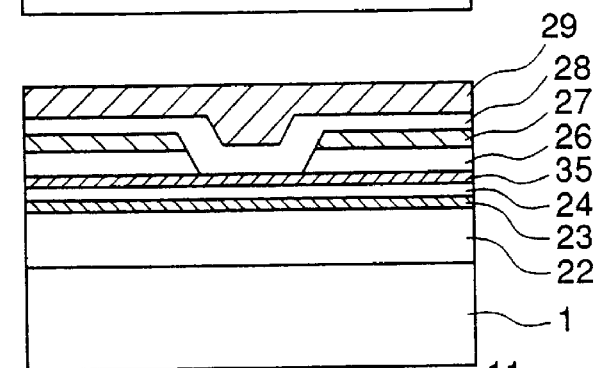
Figure 20:
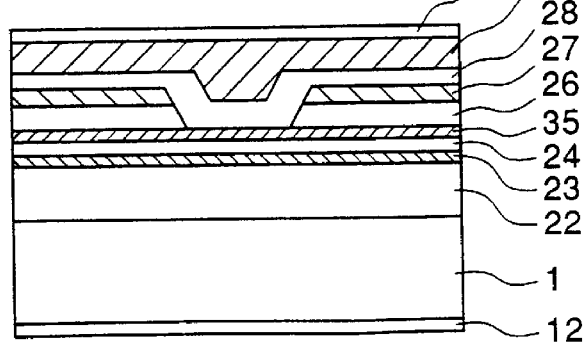

A description is given of the method of fabricating the SAS semiconductor laser device. In FIGS. 16(a)–16(c), the same process steps as those shown in FIGS. 12(a)–12(c) of the fourth embodiment are performed, and the stripe-shaped groove 40 is formed by etching until the p type $Al_{0.15}Ga_{0.85}As$ protecting layer 25 is exposed. In the step of FIG. 16(d), after removal of the resist film 30, a p type $Al_{0.25}Ga_{0.75}As$ buffer layer 34, a p type $Al_{0.55}Ga_{0.45}As$ second upper cladding layer 28, and a p type GaAs contact layer 29 are successively grown by MOCVD over the entire surface. In this growth, each thickness of the p type $Al_{0.15}Ga_{0.85}As$ protecting layer 25 and the p type $Al_{0.25}Ga_{0.75}As$ buffer layer 34 is set to produce a band gap energy equal to or larger than that of the $Al_{0.12}Ga_{0.88}As$ active layer 23 due to the quantum effect. Finally, after the n type GaAs substrate 1 is ground to a thickness of about 100 $\mu$m, a front surface electrode 11 is formed on a surface of the contact layer 29 and a rear surface electrode 12 is formed at the rear surface of the GaAs substrate 1, followed by forming laser facets and separating chips by a method such as cleaving, resulting in an SAS semiconductor laser device as shown in FIG. 17.

In the sixth embodiment of the invention, by employing the p type $Al_{0.7}Ga_{0.3}As$ etching stop layer 32 as in the fourth embodiment, the $Al_{0.15}Ga_{0.85}As$ protecting layer 25 remains with good reproducibility, after the etching for forming the stripe-shaped groove 40, whereby the exposure of the $Al_{0.55}Ga_{0.45}As$ first upper cladding layer 24 can be prevented. Further, as in the fifth embodiment, since the $Al_{0.25}Ga_{0.75}As$ buffer layer 34 having a small Al composition ratio is regrown on the $Al_{0.15}Ga_{0.85}As$ protecting layer 25 and the $Al_{0.55}Ga_{0.45}As$ second upper cladding layer 28 is grown on the buffer layer 34, generation of dislocations in the buffer layer 34 is suppressed better than when the second upper cladding layer 28 is regrown directly on the protecting layer 25. Therefore, generation of defects, such as dislocations, in the p type $Al_{0.55}Ga_{0.45}As$ second upper cladding layer 28 and the p type GaAs contact layer 29 can be suppressed and deterioration of laser characteristics caused by the defects can be prevented more effectively than in the fourth and fifth embodiments.

While the Al composition ratio x of the $Al_xGa_{1-x}As$ protecting layer 25 is 0.15, it may be in the range of 0<x<0.3, smaller than that of the upper cladding layer 24. While the Al composition ratio of the AlGaAs buffer layer 34 is 0.25, it may be smaller than that of the AlGaAs second upper cladding layer 28. In addition, the AlGaAs layers except the protecting layer 25 and the buffer layer 34 may have Al composition ratios different from the values described. While the thickness of the $Al_xGa_{1-x}As$ protecting layer 25 is 5 nm, it may be set to produce a band gap energy equal to or larger than that of the AlGaAs active layer 23 due to the quantum effect. While the thickness of the AlGaAs buffer layer 34 is 5 nm, it may be set to produce a band gap energy equal to or larger than that of the AlGaAs active layer 23 due to the quantum effect.

[Embodiment 7]

Structure 1

In a method of fabricating a semiconductor laser device according to a seventh embodiment of the present invention, which includes the fabricating method of each of the third and fourth embodiments shown in FIGS. 9(a)–9(d) and 12(a)–12(d), after the formation of the stripe-shaped groove 40, a surface of the p type $Al_{1-x}Ga_xAs$ protecting layer 25 is cleaned in the vapor phase before the AlGaAs second upper cladding layer 28 and the GaAs contact layer 29 are successively formed. Therefore, a layer including impurities on the surface of the protecting layer 25 is removed, whereby generation of defects, such as dislocations, in the AlGaAs second upper cladding layer 28 and the GaAs contact layer 29, which are grown above the protecting layer 25, can be suppressed and deterioration of laser characteristics caused by the defects can be prevented more effectively than when no cleaning is performed.

Structure 2

In a method of fabricating a semiconductor laser device according to the seventh embodiment of the present invention, which includes the fabricating method of each of the fifth and sixth embodiments shown in FIGS. 14(a)–14(d) and 16(a)–16(d), after the formation of the stripe-shaped groove 40, a surface of the p type $Al_{1-x}Ga_xAs$ protecting layer 25 is cleaned in the vapor phase before the AlGaAs buffer layer 34 is formed. Therefore, a layer including impurities on the surface of the protecting layer 25 is removed, whereby generation of defects, such as dislocations, in the AlGaAs buffer layer 34, the AlGaAs second upper cladding layer 28, and the GaAs contact layer 29, which are grown above the protecting layer 25, can be suppressed and deterioration of laser characteristics caused by the defects can be prevented more effectively than when no cleaning is performed.

Embodiment 7

In a method of fabricating an SAS semiconductor laser device having a double heterostructure and having an oscillation wavelength in the vicinity of 0.78–0.81 μm according to the seventh embodiment of the present invention, after the etching for forming the stripe-shaped groove 40 in the third to sixth embodiments of the invention, a surface of the p type $Al_{0.15}Ga_{0.85}As$ protecting layer 25 that is exposed in the bottom of the stripe-shaped groove 40 is cleaned with HCl gas in the vapor phase, and the p type $Al_{0.55}Ga_{0.45}As$ second upper cladding layer 28 or the p type $Al_{0.25}Ga_{0.75}As$ buffer layer 34 is grown on the protecting layer 25.

In the seventh embodiment of the invention, since the surface of the $Al_{0.15}Ga_{0.85}As$ protecting layer 25 is cleaned with HCl gas, a layer including impurities on the surface of the protecting layer 25 can be removed. Therefore, generation of defects, such as dislocations, in the $Al_{0.15}Ga_{0.75}As$ buffer layer 34, the $Al_{0.55}Ga_{0.45}As$ second upper cladding layer 28, and the p type GaAs contact layer 29, which are grown above the protecting layer 25, can be suppressed and deterioration of laser characteristics caused by the defects can be prevented more effectively than when no cleaning is performed.

What is claimed is:

1. A method of fabricating a semiconductor laser device including:
    preparing a lower cladding layer comprising a first conductivity type semiconductor;
    successively forming an active layer and upper cladding layers of a second conductivity type, opposite the first conductivity type, on the lower cladding layer;
    etching and removing portions of the upper cladding layers except for regions of the upper cladding layers where current is to flow and having a first depth to form a stripe-shaped ridge structure comprising remaining regions of the upper cladding layers; and
    forming a buffer layer comprising $Al_xGa_{1-x}As$ having an Al composition ratio x of 0 to 0.3, grown on a surface of the upper cladding layers exposed by etching and growing a current blocking layer comprising first conductivity type $Al_yGa_{1-y}As$ having an Al composition ratio y of at least 0.5 on the buffer layer to bury portions of the upper cladding layers not removed by etching.

2. The fabricating method of claim 1 wherein
    said upper cladding layers comprise a first upper cladding layer, an etching stopper layer comprising $Al_zGa_{1-z}As$ having an Al composition ratio z at least 0.6 or more, and a second upper cladding layer comprising $Al_wGa_{1-w}As$ having an Al composition ratio w not exceeding 0.6 and having a region where a current flows, successively laminated on said active layer and
    said stripe-shaped ridge structure including forming by etching which is stopped when a surface of the etching stopper layer is exposed to form the stripe-shaped ridge structure.

3. The fabricating method of claim 1 wherein said buffer layer has a thickness not exceeding the maximum thickness among the thicknesses at which the refractive index of a region where light emitted from the active layer is distributed in the ridge structure and under the ridge structure, i.e., in the lower cladding layer, the active layer, the upper cladding layers, and the etching stopper layer, is larger than refractive indices of regions on both sides of the region where the emitted light is distributed by at least 0.007.

4. The fabricating method of claim 2 wherein said buffer layer has a thickness not exceeding the maximum thickness among the thicknesses at which the refractive index of a region where light emitted from the active layer is distributed in the ridge structure and under the ridge structure, i.e., in the lower cladding layer, the active layer, the upper cladding layers, and the etching stopper layer, is larger than refractive indices of regions on both sides of the region where the emitted light is distributed by at least 0.007.

5. The fabricating method of a semiconductor laser device of claim 1 wherein said buffer layer comprises $Al_xGa_{1-x}As$ having an Al composition ratio x of 0 to 0.3 and which is grown at a growth temperature of 300° C. to 500° C.

6. The fabricating method of a semiconductor laser device of claim 2 wherein said buffer layer comprises $Al_xGa_{1-x}As$ having an Al composition ratio x of 0 to 0.3 and which is grown at a growth temperature of 300° C. to 500° C.

7. The fabricating method of a semiconductor laser device of claim 3 wherein said buffer layer comprises $Al_xGa_{1-x}As$ having an Al composition ratio x of 0 to 0.3 and which is grown at a growth temperature of 300° C. to 500° C.

8. The fabricating method of a semiconductor laser device of claim 4 wherein said buffer layer comprises $Al_xGa_{1-x}As$ having an Al composition ratio x of 0 to 0.3 which is grown at the growth temperature of 300° C. to 500° C.

9. A method of fabricating a semiconductor laser device including:
    preparing a lower cladding layer comprising a first conductivity type semiconductor;
    successively forming an active layer, an AlGaAs first upper cladding layer of the second conductivity type, opposite the first conductivity type, a first etching stopper layer comprising second conductivity type $Al_xGa_{1-x}As$ having an Al composition ratio x larger than 0 and not exceeding 0.3, a second etching stopper layer comprising second conductivity type $Al_yGa_{1-y}As$ having an Al composition ratio y of at least 0.6, a second upper cladding layer comprising second conductivity type $Al_zGa_{1-z}As$ having an Al composition ratio z not exceeding 0.6 and having a region where a current flows, and a cap layer comprising a second conductivity type semiconductor, on the lower cladding layer;

removing a portion, except a region of the second upper cladding layer, by etching which is stopped when a surface of the second etching stopper layer is exposed and removing a portion of the exposed second etching stopper layer, thereby forming a stripe-shaped ridge structure comprising remaining regions of the second upper cladding layer and the second etching stopper layer; and forming a current blocking layer burying the portions of the second upper cladding layer and the second etching stopper layer not removed by etching.

10. The fabricating method of claim 9 wherein said first etching stopper layer has a thickness smaller than the minimum thickness that absorbs light emitted from said active layer.

11. A semiconductor laser device fabricated by:

preparing a lower cladding layer comprising a first conductivity type semiconductor;

successively forming, on the lower cladding layer, an active layer and upper cladding layers comprising a second conductivity type semiconductor, opposite in conductivity type from the first conductivity type;

etching and removing portions of the upper cladding layers to form a stripe-shaped ridge structure comprising remaining regions of the upper cladding layers; and forming a buffer layer comprising $Al_xGa_{1-x}As$ having an Al composition ratio x of 0 to 0.3 on surfaces of the upper cladding layers exposed by etching and forming a current blocking layer comprising first conductivity type $Al_yGa_{1-y}As$ having an Al composition ratio y of at least 0.5 on the buffer layer to bury portions of the upper cladding layers remaining after etching.

12. The semiconductor laser device of claim 11 wherein:

the upper cladding layers comprise a first upper cladding layer, and an etching stop layer comprising $Al_zGa_{1-z}As$ having an Al composition ratio z of at least 0.6, and a second upper cladding layer comprising $Al_wGa_{1-w}As$ having an Al composition ratio w not exceeding 0.6, successively laminated on the active layer; and the stripe-shaped ridge structure is formed by removing portions of the second upper cladding layer by etching which is stopped when the etching stop layer is exposed, the stripe-shaped ridge structure comprising a remaining region of the second upper cladding layer.

13. The semiconductor laser device of claim 11 wherein the buffer layer has a thickness not exceeding the maximum thickness at which the refractive index of a region where light emitted from the active layer is distributed in the ridge structure and under the ridge structure, i.e., in the lower cladding layer, the active layer, the upper cladding layers, and the etching stop layer, is larger than refractive indices of regions on opposite sides of the region when the emitted light is distributed by at least 0.007.

14. The semiconductor laser device of claim 12 wherein the buffer layer has a thickness not exceeding the maximum thickness at which the refractive index of a region where light emitted from the active layer is distributed in the ridge structure and under the ridge structure, i.e., in the lower cladding layer, the active layer, the upper cladding layers, and the etching stop layer, is larger than refractive indices of regions on opposite sides of the region when the emitted light is distributed by at least 0.007.

15. A semiconductor laser device fabricated by:

preparing a lower cladding layer comprising a first conductivity type semiconductor;

successively forming, on the lower cladding layer, an active layer, a first upper cladding layers comprising second conductivity type AlGaAs, opposite in conductivity type from the first conductivity type, an etching stop layer comprising second conductivity type $Al_xGa_{1-x}As$ having an Al composition ratio x larger than 0 and not exceeding 0.3, a second etching stop layer comprising second conductivity type $Al_yGa_{1-y}As$ having an Al composition ratio y of at least 0.6, a second upper cladding layer comprising second conductivity type $Al_zGa_{1-z}As$ having an Al composition ratio z not exceeding 0.6, and a cap layer comprising a second conductivity type semiconductor;

removing a portion of the second upper cladding layer by etching which is stopped when the first etching stop layer is exposed, thereby forming a stripe-shaped ridge structure comprising remaining regions of the second upper cladding layer and the second etching stop layer; and forming a current blocking layer burying the portions of the second upper cladding layer and the second etching stop layer remaining after etching.

16. The semiconductor laser device of claim 15 wherein the first etching stop layer has a thickness smaller than a minimum thickness that causes absorption of light emitted from the active layer.

17. A method of fabricating a self-aligned structure (SAS) semiconductor laser device having a double heterostructure including:

preparing a first conductivity type GaAs substrate;

successively forming a lower cladding layer comprising first conductivity type AlGaAs, an active layer comprising AlGaAs and having a band gap energy, a first upper cladding AlGaAs layer of the second conductivity type, opposite the first conductivity type, and having an Al composition ratio, a protecting layer comprising second conductivity type $Al_xGa_{1-x}As$ having an Al composition ratio x of 0<x<0.3, smaller than that of the first upper cladding layer, and having a thickness at which a band gap energy thereof is at least equal to the band gap energy of the active layer, a current blocking layer comprising first conductivity type AlGaAs having an Al composition ratio larger than that of the protecting layer, and a cap layer comprising second conductivity type GaAs, on the first conductivity type GaAs substrate;

depositing a covering film having a stripe-shaped opening on the GaAs cap layer;

using the covering film as a mask, selectively etching the GaAs cap layer and the AlGaAs current blocking layer in the opening of the covering film until a surface of the $Al_xGa_{1-x}As$ protecting layer is exposed, thereby forming a stripe-shaped groove, and removing the covering film; and successively forming a second upper cladding layer comprising second conductivity type AlGaAs having an Al composition ratio larger than that of the protecting layer and a contact layer comprising second conductivity type GaAs including on the inner surface of the stripe-shaped groove.

18. A method of fabricating a self-aligned structure (SAS) semiconductor laser device having a double heterostructure including:

preparing a first conductivity type GaAs substrate;

successively forming a lower cladding layer comprising first conductivity type AlGaAs, an active layer comprising AlGaAs and having a band gap energy, a first upper cladding AlGaAs layer of the second conductivity type, opposite the first conductivity type, and having an Al composition ratio, a protecting layer comprising second conductivity type $Al_xGa_{1-x}As$ having an Al composition ratio x of 0<x<0.3 smaller than that of the first upper cladding layer and having a thickness at which a band gap energy thereof is at least equal to the band gap energy of the active layer, an etching stopper layer comprising second conductivity type AlGaAs having an Al composition ratio larger than that of the protecting layer, a current blocking layer comprising first conductivity type GaAs, and a cap layer comprising second conductivity type GaAs, on the first conductivity type GaAs substrate;

depositing a covering film having a stripe-shaped opening on the GaAs cap layer;

using the covering film as a mask, selectively etching the GaAs cap layer and the GaAs current blocking layer in the opening of the covering film until a surface of the AlGaAs etching stopper layer is exposed and selectively etching the AlGaAs etching stopper layer until a surface of the $Al_xGa_{1-x}As$ protecting layer is exposed, thereby forming a stripe-shaped groove, and removing the covering film; and successively forming a second upper cladding layer comprising second conductivity type AlGaAs having an Al composition ratio larger than that of the protecting layer and a contact layer comprising second conductivity type GaAs, including on the inner surface of the stripe-shaped groove.

19. The fabricating method of claim 17 wherein after the formation of the stripe-shaped groove, a buffer layer comprising second conductivity type AlGaAs having an Al composition ratio smaller than that of the AlGaAs second upper cladding layer is formed over the inner surface of the stripe-shaped groove before said AlGaAs second upper cladding layer and said GaAs contact layer are successively formed.

20. The fabricating method of claim 18 wherein after the formation of the stripe-shaped groove, a buffer layer comprising second conductivity type AlGaAs having an Al composition ratio smaller than that of the AlGaAs second upper cladding layer is formed over the inner surface of the stripe-shaped groove before said AlGaAs second upper cladding layer and said GaAs contact layer are successively formed.

21. The fabricating method of claim 17 wherein after the formation of said stripe-shaped groove, a surface of said $Al_{1-x}Ga_xAs$ protecting layer is cleaned by a vapor phase before said AlGaAs second upper cladding layer and said GaAs contact layer are successively formed thereon.

22. The fabricating method of claim 18 wherein after the formation of said stripe-shaped groove, a surface of said $Al_{1-x}Ga_xAs$ protecting layer is cleaned by a vapor phase before said AlGaAs second upper cladding layer and said GaAs contact layer are successively formed thereon.

23. The fabricating method of claim 19 wherein after the formation of said stripe-shaped groove, a surface of said $Al_{1-x}Ga_xAs$ protecting layer is cleaned by a vapor phase before said AlGaAs buffer layer is formed thereon.

24. The fabricating method of claim 20 wherein after the formation of said stripe-shaped groove, a surface of said $Al_{1-x}Ga_xAs$ protecting layer is cleaned by a vapor phase before said AlGaAs buffer layer is formed thereon.

25. An SAS semiconductor laser device having a double heterostructure fabricated by:

preparing a first conductivity type GaAs substrate;

successively forming, on the first conductivity type GaAs substrate, a lower cladding layer comprising first conductivity type AlGaAs, an active layer comprising AlGaAs and having a band gap energy, a first upper cladding layer comprising second conductivity type AlGaAs, opposite in conductivity type from the first conductivity type, and having an Al composition ratio, a protecting layer comprising second conductivity type $Al_xGa_{1-x}As$ having an Al composition ratio x of 0<x<0.3, smaller than the Al composition ratio of the first upper cladding layer, and having a thickness at which a band gap energy of the protecting layer is at least equal to the band gap energy of the active layer due to a quantum effect, a current blocking layer comprising first conductivity type AlGaAs having an Al composition ratio larger than the Al composition ratio of the protecting layer, and a cap layer comprising second conductivity type GaAs;

successively etching the GaAs cap layer and the AlGaAs current blocking layer in a stripe-shaped region until the $Al_xGa_{1-x}As$ protecting layer is exposed, thereby forming a stripe-shaped groove; and successively forming a second upper cladding layer comprising second conductivity type AlGaAs having an Al composition ratio larger than the Al composition ratio of the protecting layer, and a contact layer comprising second conductivity type GaAs on a inner surface of the stripe-shaped groove.

26. An SAS semiconductor laser device having a double heterostructure fabricated by:

preparing a first conductivity type GaAs substrate;

successively forming, on the first conductivity type GaAs substrate, a lower cladding layer comprising first conductivity type AlGaAs, an active layer comprising AlGaAs and having a band gap energy, a first upper cladding layer comprising second conductivity type AlGaAs, opposite in conductivity type from the first conductivity type, and having an Al composition ratio, a protecting layer comprising second conductivity type $Al_xGa_{1-x}As$ having an Al composition ratio x of 0<x<0.3, smaller than the Al composition ratio of the first upper cladding layer, and having a thickness at which a band gap energy of the protecting layer is at least equal to the band gap energy of the active layer due to a quantum effect, an etching stop layer comprising second conductivity type AlGaAs having an Al composition ratio larger than the Al composition ratio of the protecting layer, a current blocking layer comprising first conductivity type GaAs, and a cap layer comprising second conductivity type GaAs;

successively etching the GaAs cap layer and the GaAs current blocking layer in a stripe-shaped region until the AlGaAs etching stop layer is exposed and selectively etching the AlGaAs etching stop layer until the $Al_xGa_{1-x}As$ protecting layer is exposed, thereby forming a stripe-shaped groove; and successively forming a second upper cladding layer comprising second conductivity type AlGaAs having an Al composition ratio larger than the Al composition ratio of the protecting layer, and a contact layer comprising second conductivity type GaAs on a inner surface of the stripe-shaped groove.

27. The semiconductor laser device of claim 25 wherein, after the formation of the stripe-shaped groove, a buffer layer comprising second conductivity type AlGaAs having an Al composition ratio smaller than the Al composition ratio of the AlGaAs second upper cladding layer is formed before the AlGaAs second upper cladding layer is formed.

28. The semiconductor laser device of claim 26 wherein, after the formation of the stripe-shaped groove, a buffer layer comprising second conductivity type AlGaAs having an Al composition ratio smaller than the Al composition ratio of the AlGaAs second upper cladding layer is formed before the AlGaAs second upper cladding layer is formed.

* * * * *

UNITED STATES PATENT AND TRADEMARK OFFICE
CERTIFICATE OF CORRECTION

PATENT NO. : 5,835,516
DATED : November 10, 1998
INVENTOR(S) : Miyashita et al.

It is certified that error appears in the above-identified patent and that said Letters Patent is hereby corrected as shown below:

Column 34, Line 14, after "z" insert --of--;

Line 14, delete "or more"--;

Line 56, change "the" to --a--;

Column 36, Line 9, change "layers" to --layer--;

Column 38, Line 36, change "a" to --an--;

Column 39, Line 5, change "a" to --an--.

Signed and Sealed this

Sixth Day of April, 1999

Q. TODD DICKINSON

Attest:

*Attesting Officer*           *Acting Commissioner of Patents and Trademarks*